US011392193B2

(12) United States Patent
Tajalli

(10) Patent No.: US 11,392,193 B2
(45) Date of Patent: *Jul. 19, 2022

(54) DYNAMIC VOLTAGE SCALING IN HIERARCHICAL MULTI-TIER REGULATOR SUPPLY

(71) Applicant: Kandou Labs SA, Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/235,721

(22) Filed: Apr. 20, 2021

(65) Prior Publication Data
US 2021/0240253 A1 Aug. 5, 2021

Related U.S. Application Data

(63) Continuation of application No. 16/218,386, filed on Dec. 12, 2018, now Pat. No. 10,983,587.
(Continued)

(51) Int. Cl.
G06F 1/00 (2006.01)
G06F 1/3296 (2019.01)
(Continued)

(52) U.S. Cl.
CPC ........ G06F 1/3296 (2013.01); G01R 31/3004 (2013.01); G01R 31/3016 (2013.01);
(Continued)

(58) Field of Classification Search
CPC ........ G06F 1/324; G06F 1/3296; G05F 1/462; H04L 25/0272; Y02D 10/00
See application file for complete search history.

(56) References Cited

U.S. PATENT DOCUMENTS 7,142,865 B2 11/2006 Tsai et al.
7,164,631 B2 1/2007 Tateishi et al.
(Continued)

OTHER PUBLICATIONS

International Search Report and Written Opinion for PCT/US2018/065282, dated Mar. 29, 2019, 1-8 (8 pages).
(Continued)

Primary Examiner — Nitin C Patel
(74) Attorney, Agent, or Firm — Invention Mine LLC

(57) ABSTRACT

Obtaining a periodic test signal, sampling the periodic test signal using a sampling element according to a sampling clock to generate a sampled periodic output, the sampling element operating according to a supply voltage provided by a voltage regulator, the voltage regulator providing the supply voltage according to a supply voltage control signal, comparing the sampled periodic output to the sampling clock to generate a clock-to-Q measurement indicative of a delay value associated with the generation of the sampled periodic output in response to the sampling clock, generating the supply voltage control signal based at least in part on an average of the clock-to-Q measurement, and providing the supply voltage to a data sampling element connected to the voltage regulator, the data sampling element being a replica of the sampling element, the data sampling element sampling a stream of input data according to the sampling clock.

28 Claims, 22 Drawing Sheets

Related U.S. Application Data

(60) Provisional application No. 62/711,432, filed on Jul. 27, 2018, provisional application No. 62/683,442, filed on Jun. 11, 2018, provisional application No. 62/597,415, filed on Dec. 12, 2017, provisional application No. 62/597,902, filed on Dec. 12, 2017.

(51) Int. Cl.
*G05F 1/46* (2006.01)
*G06F 1/324* (2019.01)
*G01R 31/30* (2006.01)
*H04L 25/02* (2006.01)

(52) U.S. Cl.
CPC .............. *G05F 1/462* (2013.01); *G06F 1/324* (2013.01); *H04L 25/0272* (2013.01)

(56) References Cited

U.S. PATENT DOCUMENTS

| | | | |
|---|---|---|---|
| 8,161,431 | B2 | 4/2012 | Buonpane et al. |
| 8,310,389 | B1 | 11/2012 | Chui et al. |
| 8,370,654 | B1 | 2/2013 | Hasko et al. |
| 8,443,223 | B2 | 5/2013 | Abbasfar |
| 8,898,504 | B2 | 11/2014 | Baumgartner et al. |
| 9,223,327 | B1 | 12/2015 | Zhu et al. |
| 9,288,089 | B2 | 3/2016 | Cronie et al. |
| 9,300,503 | B1 | 3/2016 | Holden et al. |
| 10,326,623 | B1 | 6/2019 | Tajalli |
| 2004/0183559 | A1 | 9/2004 | Perego et al. |
| 2005/0195000 | A1 | 9/2005 | Parker et al. |
| 2008/0297133 | A1 | 12/2008 | Duan et al. |
| 2010/0253314 | A1 | 10/2010 | Bitting |
| 2010/0283894 | A1 | 11/2010 | Horan et al. |
| 2012/0146672 | A1 | 6/2012 | Winter et al. |
| 2012/0293195 | A1 | 11/2012 | Bourstein |
| 2013/0114519 | A1 | 5/2013 | Gaal et al. |
| 2013/0264871 | A1 | 10/2013 | Zerbe et al. |
| 2014/0376604 | A1 | 12/2014 | Verlinden et al. |
| 2017/0060221 | A1 | 3/2017 | Yu et al. |

OTHER PUBLICATIONS

Choi, Kyu-Won, et al., "Hierarchical Power Optimization for System-on-a-Chip (SoC) through CMOS Technology Scaling", School of Electrical and Computer Engineering, Georgia Institute of Technology, 2002, 1-24 (24 pages).

Lackey, David, et al., "Managing Power and Performance for System-on-Chip Designs using Voltage Islands", IEEE/ACM International Conference on Computer-Aided Design, Nov. 10-14, 2002, Dec. 2002, 195-202 (8 pages).

Riley, M. W., et al., "Cell Broadband Engine Processor: Design and Implementation", IBM Journal of Research and Development, vol. 51, No. 5, Sep. 2007, 545-557 (13 pages).

DYNAMIC VOLTAGE SCALING IN HIERARCHICAL MULTI-TIER REGULATOR SUPPLY

CROSS-REFERENCE TO RELATED APPLICATIONS

This application is a continuation of U.S. application Ser. No. 16/218,386 filed Dec. 12, 2018 now U.S. Pat. No. 10,983,587 issued on Apr. 20, 2021, entitled "Dynamic Voltage Scaling In Hierarchical Multi-Tier Regulator Supply", which claims the benefit of (i) U.S. Provisional Application No. 62/711,432, filed Jul. 27, 2018, entitled "Adaptive Voltage Scaling of Receiver", naming Armin Tajalli, of (ii) U.S. Provisional Application No. 62/683,442, filed Jun. 11, 2018, entitled "Adaptive Voltage Scaling of Receiver", naming Armin Tajalli, of (iii) U.S. Provisional Application No. 62/597,902, filed Dec. 12, 2017, entitled "Adaptive Voltage Scaling of Receiver with Decision Feedback Equalization", naming Armin Tajalli, and of (iv) U.S. Provisional Application No. 62/597,415, filed Dec. 12, 2017, entitled "Adaptive Voltage Scaling of Receiver with Decision Feedback Equalization", naming Armin Tajalli, all of which are hereby incorporated herein by reference in their entirety for all purposes.

REFERENCES

The following prior applications are herein incorporated by reference in their entirety for all purposes:

U.S. patent application Ser. No. 15/835,648, filed Dec. 8, 2017, naming Armin Tajalli, entitled "Methods and Systems for Providing Multi-Stage Distributed Decision Feedback Equalization", hereinafter identified as [Tajalli I].

This application also makes reference to the following applications for purposes of historical information or descriptive clarification:

U.S. Pat. No. 9,288,089, filed May 20, 2010 as application Ser. No. 12/784,414 and issued Mar. 15, 2016, naming Harm Cronie and Amin Shokrollahi, entitled "Orthogonal Differential Vector Signaling", hereinafter identified as [Cronie]

U.S. patent application Ser. No. 13/842,740, filed Mar. 15, 2013, naming Brian Holden, Amin Shokrollahi, and Anant Singh, entitled "Methods and Systems for Skew Tolerance in and Advanced Detectors for Vector Signaling Codes for Chip-to-Chip Communication", hereinafter identified as [Holden].

BACKGROUND

In many system environments, the power consumption of high speed data communications interface devices can be a significant portion of the overall power budget. A portion of this power consumption is fixed by the physical attributes of the communication network, requiring particular voltages to be induced in a predetermined transmission line impedance, that transmitted signal overcoming a known attenuation factor before being detected at a receiver. The remaining interface power consumption may be addressed by means known to the art, including integrated circuit process selection, clock speed minimization, and control of system power voltages.

For a given integrated circuit design and process, normal production variations will result in devices capable of operation over a range of clock speeds and supply voltages. Typically, unit testing will eliminate devices in which the worst case "corner" of clock speed and voltage is insufficient for correct system operation. However, that implies that significant numbers of devices are capable of operating at lower speeds and/or lower supply voltage while still satisfying the overall system performance requirements.

BRIEF DESCRIPTION

Particular circuit critical paths identified during integrated circuit design and simulation constrain the minimum required clock speed and/or supply voltage needed to satisfy system requirements. Physical instantiations of these critical paths may be extracted, and replicated within an on-chip test structure allowing their operation to be verified during normal system operation. A dynamic power control system may dynamically adjust clock speeds and/or supply voltages to minimize power consumption within these measured operational constraints.

DETAILED DESCRIPTION

In recent years, the signaling rate of high speed communications systems have reached gigabit per second speeds, with individual transmission unit intervals measured in picoseconds. To meet such stringent timing requirements, it is necessary to minimize circuit delays by minimizing node capacitances and eliminating unnecessary processing elements. Even secondary circuit characteristics such as the settling time of an analog comparator can represent a significant proportion of the available time budget.

As one example, a conventional data communications receiver's Decision Feedback Equalization (DFE) system stores historic values for one or more detected data values from previous receive unit intervals, and computes a DFE compensation value from these historic values that is subsequently applied to the received signal to facilitate the current unit interval's detection. For purposes of explanation, this computation may be simply described as comprising multiplication of each previous unit interval's data value by a predetermined scaling factor, and then summing each of these scaled results (each representing the latent effects of successive previous unit intervals on the presently received signal) to produce a composite DFE compensation value representing the cumulative predicted effect of all such previous unit intervals. In a typical receiver design, this DFE compensation value will be combined with the current receive signal input, to produce a corrected signal more accurately representing the received data value which may then be sampled in both time and amplitude to obtain a detected receive data value.

Those familiar with the art will recognize that the DFE compensation value produced as described above cannot be fully determined until the previous unit interval's data value has been detected. Thus, as data rates increase, a point will be reached at which the information needed to produce the first term of the DFE compensation value (i.e. the received data value for the previous unit interval) is not available in time to be applied to the next unit interval's detection. Indeed, at the highest data rates currently used in practice, this situation may exist for multiple previous unit intervals, as the detection time required for a single data value may represent multiple unit interval durations. Thus, it is common for embodiments to forgo this "closed loop" DFE method for one or more of the most recent unit intervals, instead relying on an "unrolled loop" or "speculative" generation of one or more elements of the DFE compensation value for these most recent unit intervals.

Figure 1:
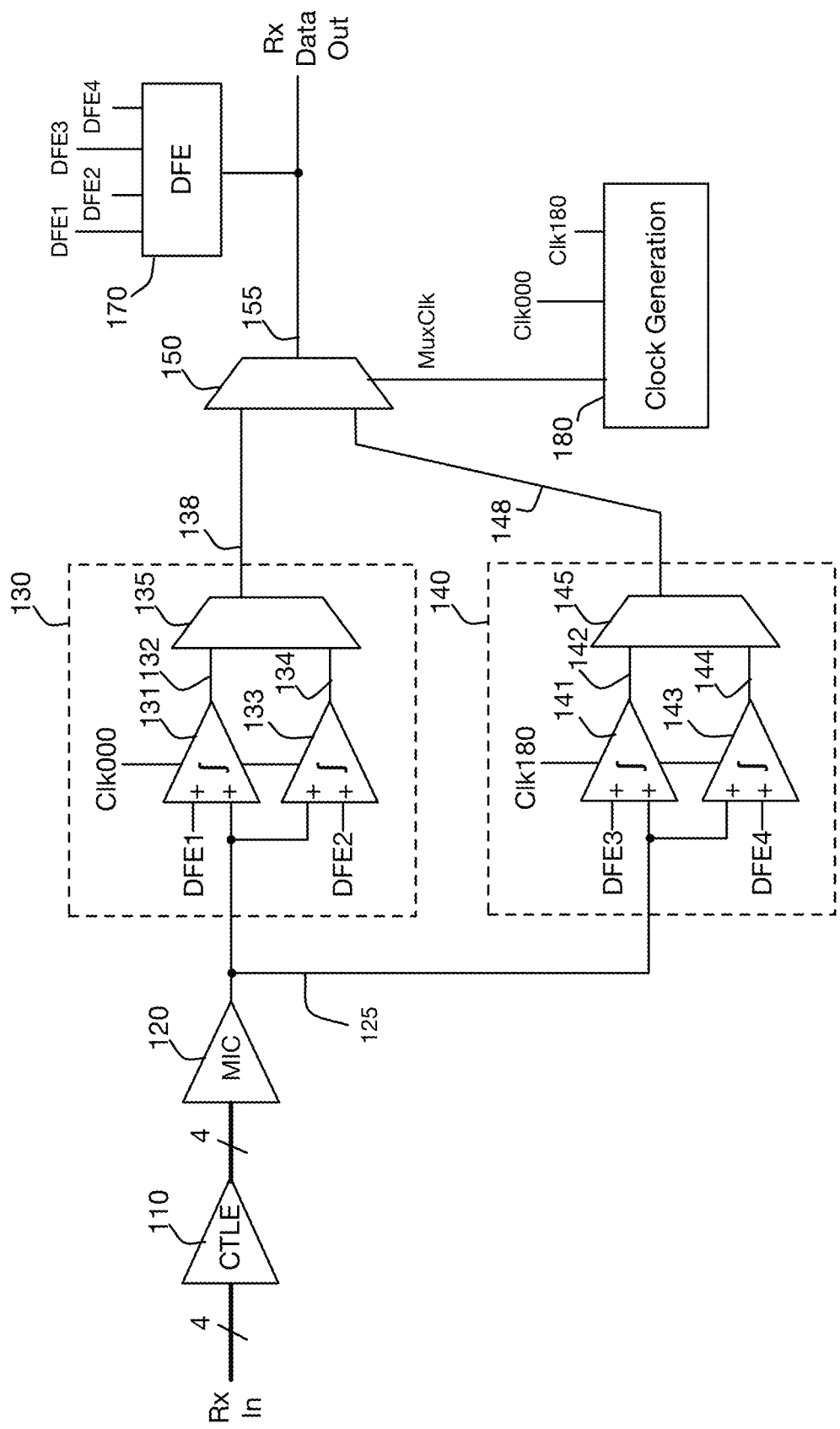
FIG. 1 is an embodiment of one channel of a data receiver utilizing Decision Feedback Equalization and multiple parallel processing stages.

FIG. 1 illustrates one embodiment of a data receiver incorporating speculative DFE for one previous receive unit interval. This example includes a receiver front end (110 and 120,) along with a full data path for one received data bit (130, 140, 150, 160); a full receiver embodiment would typically share the single frontend with data paths for additional data bits. DFE computation 170 and Clock Data Recovery 180 subsystems may in some embodiments be shared across multiple data paths, or dedicated to a particular data path.

In the illustrated example offered without implying limitation, four received wire signals are obtained from the communications channel, possibly representing two differential signal pairs or alternatively, one four-wire stream communicating three data bits encoded using an Orthogonal Differential Vector Signaling code (ODVS), as described in [Cronie]. Continuous Time Linear Equalizers 110 provide frequency-dependent amplification of the received wire signals, and Multi-Input Comparators (MIC) 120 optionally combine the amplified wire signals to reverse ODVS encoding and obtain detected data signals, as in [Holden]. In differential receiving embodiments, each such MIC will have two active inputs and will functionally act as a differential line receiver, and in single-ended receiver embodiments, receive operations are performed directly on individual wire signals, bypassing the need for any MIC functionality.

One such embodiment operates with a communication unit interval of approximately 35 picoseconds, corresponding to a data rate of approximately 28 Gigabaud. To support such data rates, the example receiver incorporates two parallel processing stages 130 and 140 in each received signal data path, each of which detects the data received from one differential wire pair or ODVS subchannel during alternating unit intervals. At the described data rate, this interleaving of parallel processors allows each processing stage two unit intervals or 70 picoseconds to capture and detect each received data bit. Given that one stage of speculative DFE is used, proper operation requires that a received data bit be fully detected and available to another processing phase before the end of that subsequent processing phase's cycle, making this a critical path for receiver operation. Additional details of this example embodiment may be found in [Tajalli I].

Figure 2:
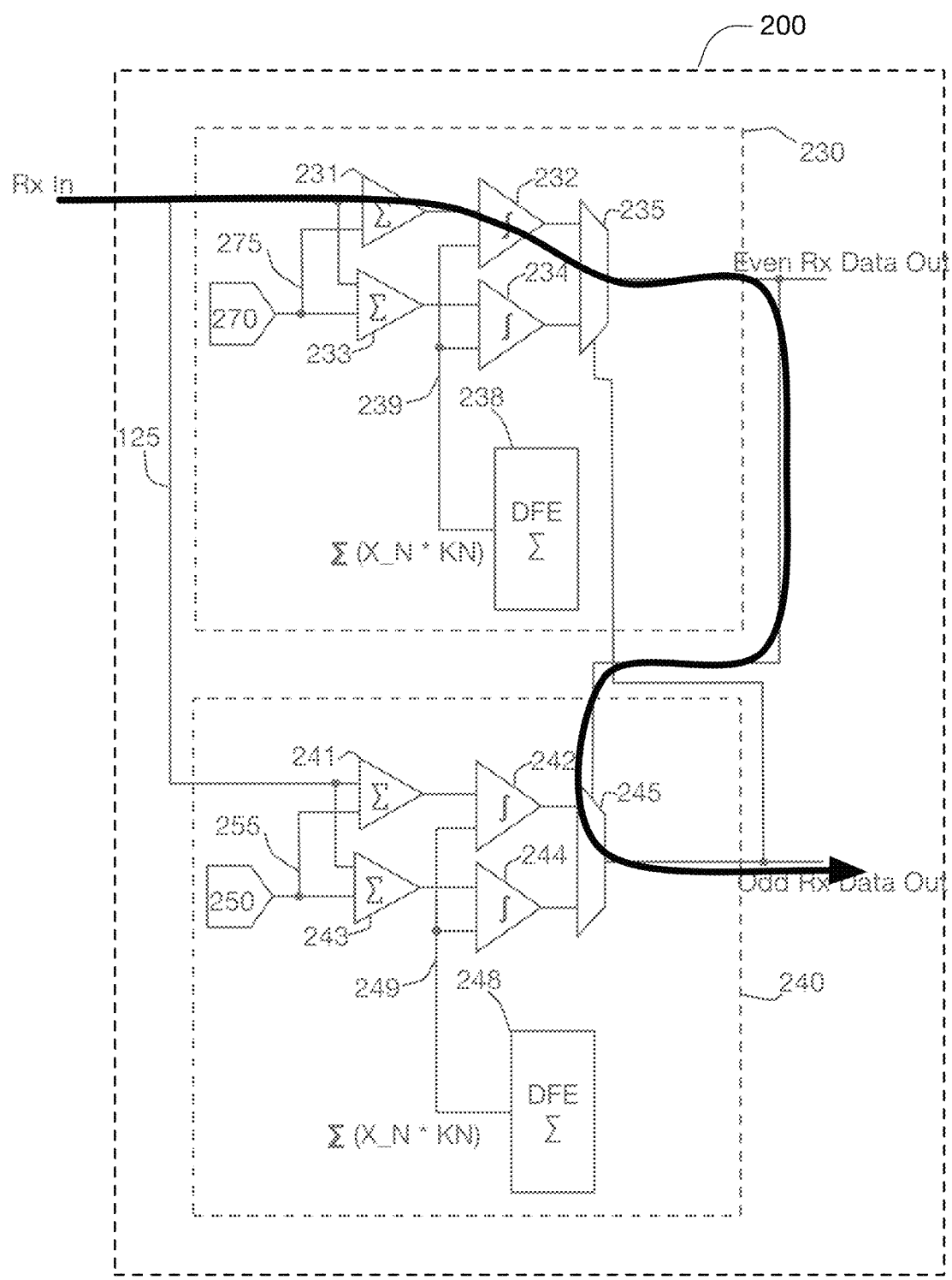
FIG. 2 shows a critical processing path in the embodiment of FIG. 1.

FIG. 2 illustrates elements of this critical path, comprising one receive processing chain from data input to detector output, and the subsequent usage of that detected data value to select a speculatively-detected result in the subsequent processing phase.

Figure 3:
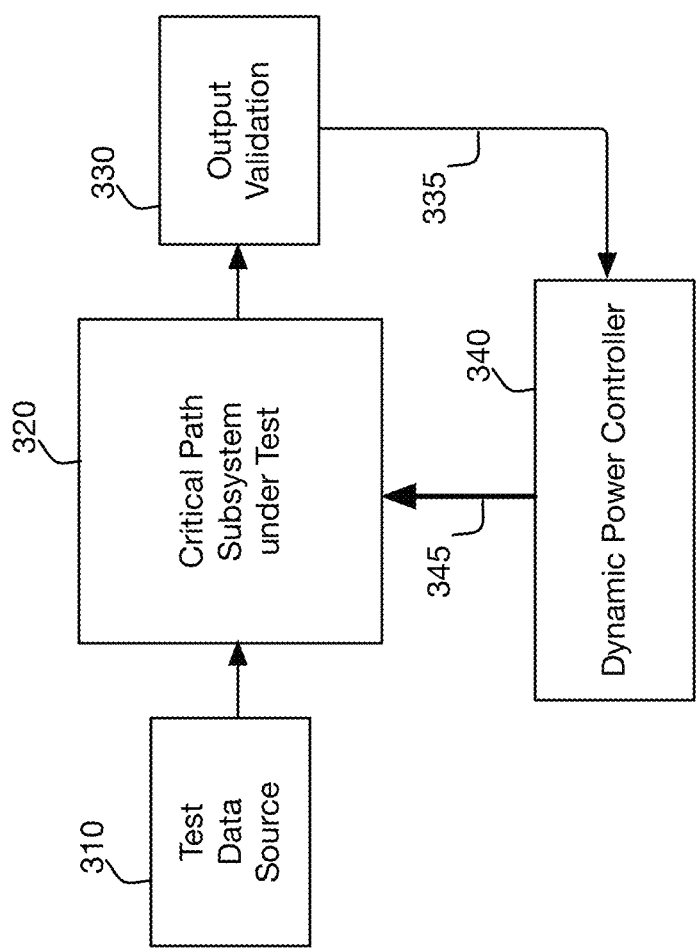
FIG. 3 shows a testable instance of a critical path embodiment within one embodiment of a dynamic power control system.

FIG. 3 shows one embodiment of a testing configuration in which such a critical path subsystem may be tested. A synthetic input data stream is created 310 and presented to the critical path subsystem 320 under test. Output from the test subsystem is validated 330 to identify whether the critical path is functioning correctly, or is out of specification. This result 335 is used to inform the Dynamic Power Controller 340 whether power 345 (or in a further embodiment, other variables such as subsystem clock) to the subsystem under test may be adjusted to a lower power consumption but potentially lower performance value. In a practical embodiment, the Critical Path Subsystem under test would comprise the subset of processing elements as identified in FIG. 2, sufficient to emulate actual operational system characteristics.

Figure 4:
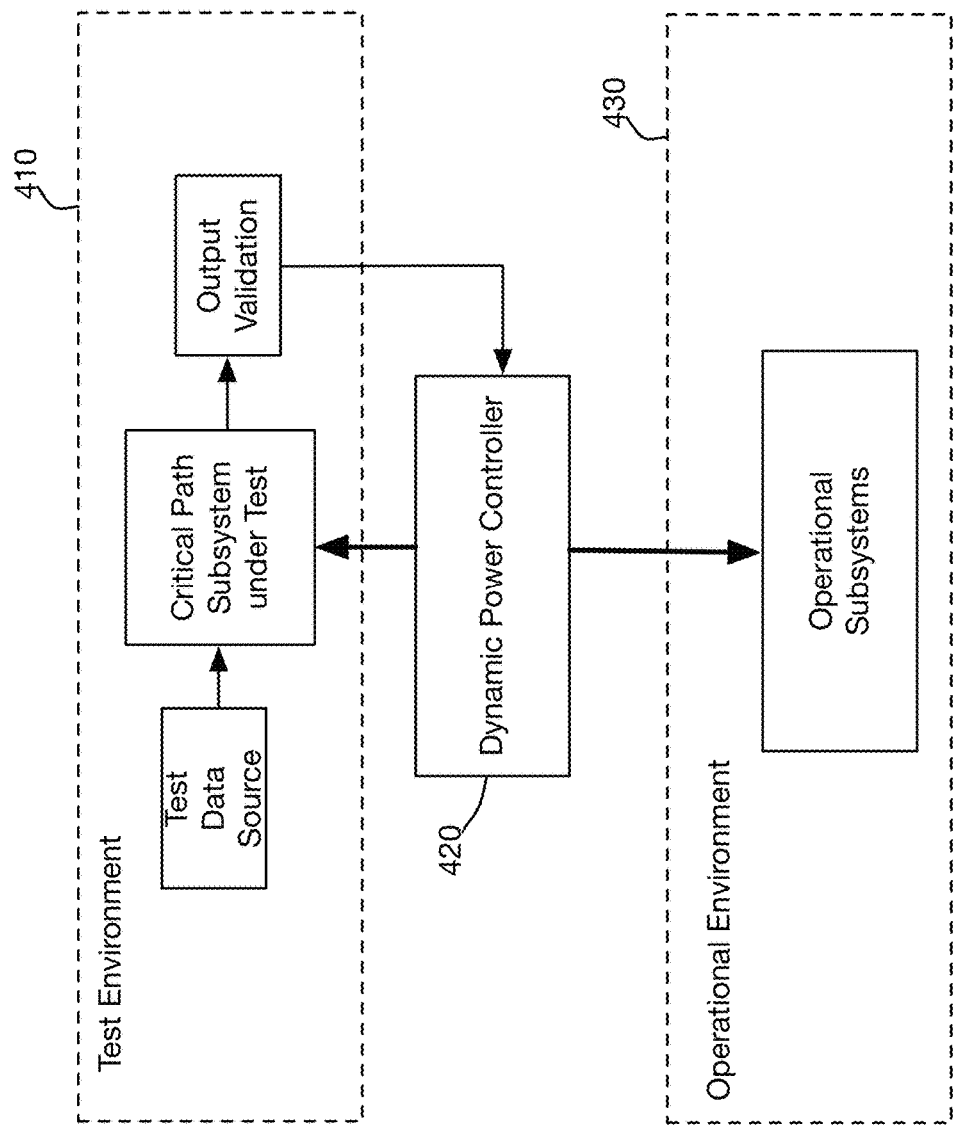
FIG. 4 shows a dynamic power control system as in FIG. 3 controlling system power.

FIG. 4 shows one embodiment, in which a test environment 410 such as previously described for FIG. 3 is dynamically exercised, allowing Dynamic Power Controller 420 to be adjusted to a lower power consumption value for both the test environment 410 and the Operational Environment 430, for which 410 is a testable proxy.

In practice, systems may include one or more subsystems capable of dynamic power control, each potentially having a unique critical path and a different response characteristic of critical operational parameters such as propagation speed and signal switching threshold as subsystem power is adjusted. In some embodiments, these different response characteristics may also be dependent on operating temperature and integrated circuit process fabrication characteristics. Thus, there may be multiple test environments, test conditions, output validations, etc. that may collectively inform a single adjustment, or may individually inform different adjustments. As one example, FIG. 5 addresses a system including three distinct power control domains, which might represent an analog subsystem, a non-speed-critical digital subsystem, and a speed-critical digital subsystem. As shown at 510, the external regulator REG observes the behavior of a test circuit operating at a voltage VDDJ, under particular process and temperature conditions. However, the proper internal voltage to support that operation must include a safety factor to compensate for device aging, internal $I^2R$ voltage drop between the internal metallization power distribution and the critical circuitry, and a safety margin to allow for noise, component and measurement tolerances, etc. Similarly, additional safety factors or margins must be applied to address additional factors between the internal power distribution of the integrated circuit and the external power system providing the regulated voltage. As shown in 510, they may include power supply noise, Package $I^2R$ losses, High Level circuit metallization $I^2R$ losses, and an additional safety margin.

Figure 5:
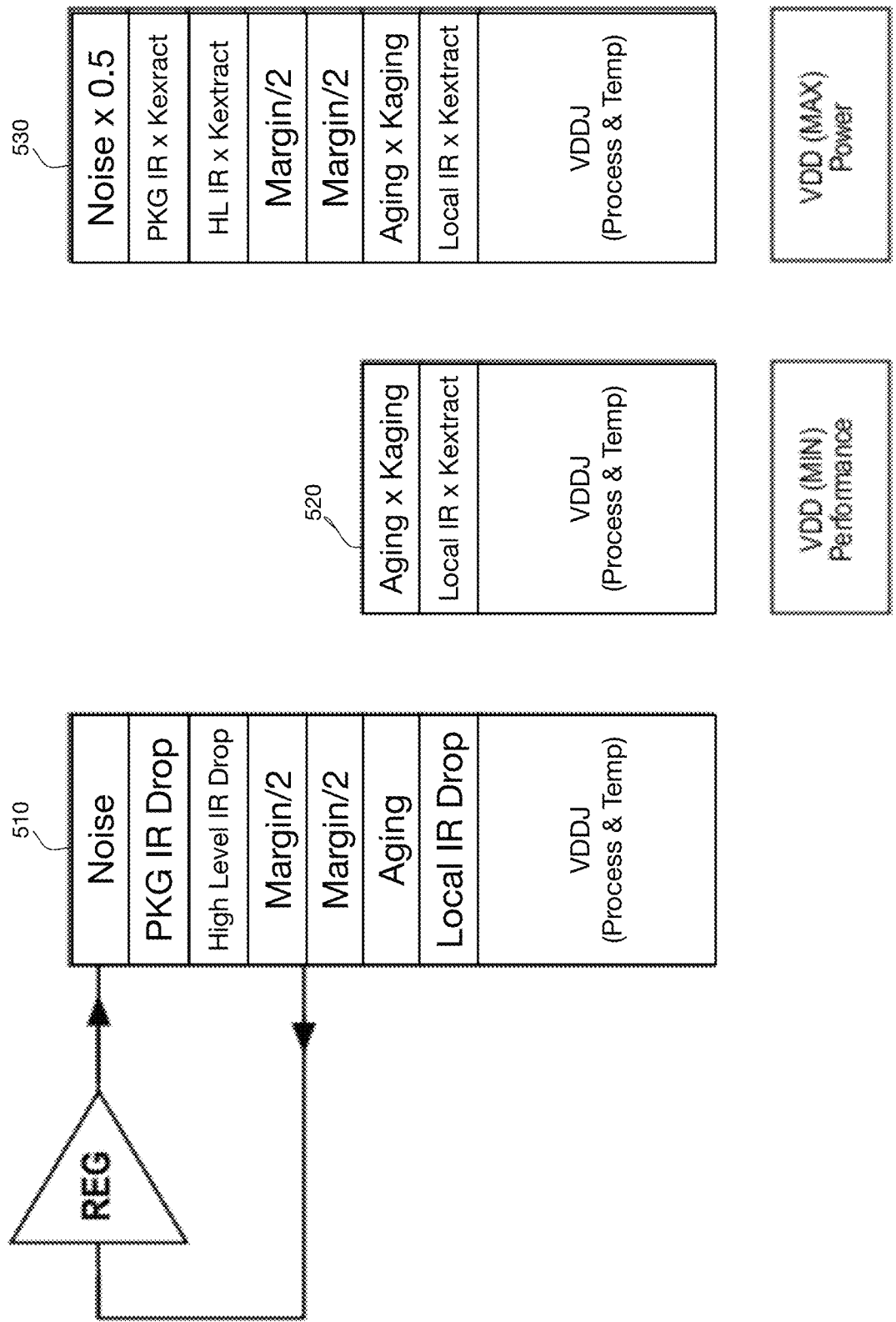
FIG. 5 illustrates the tolerances and margins to be applied to the base measurement.
Figure 6:
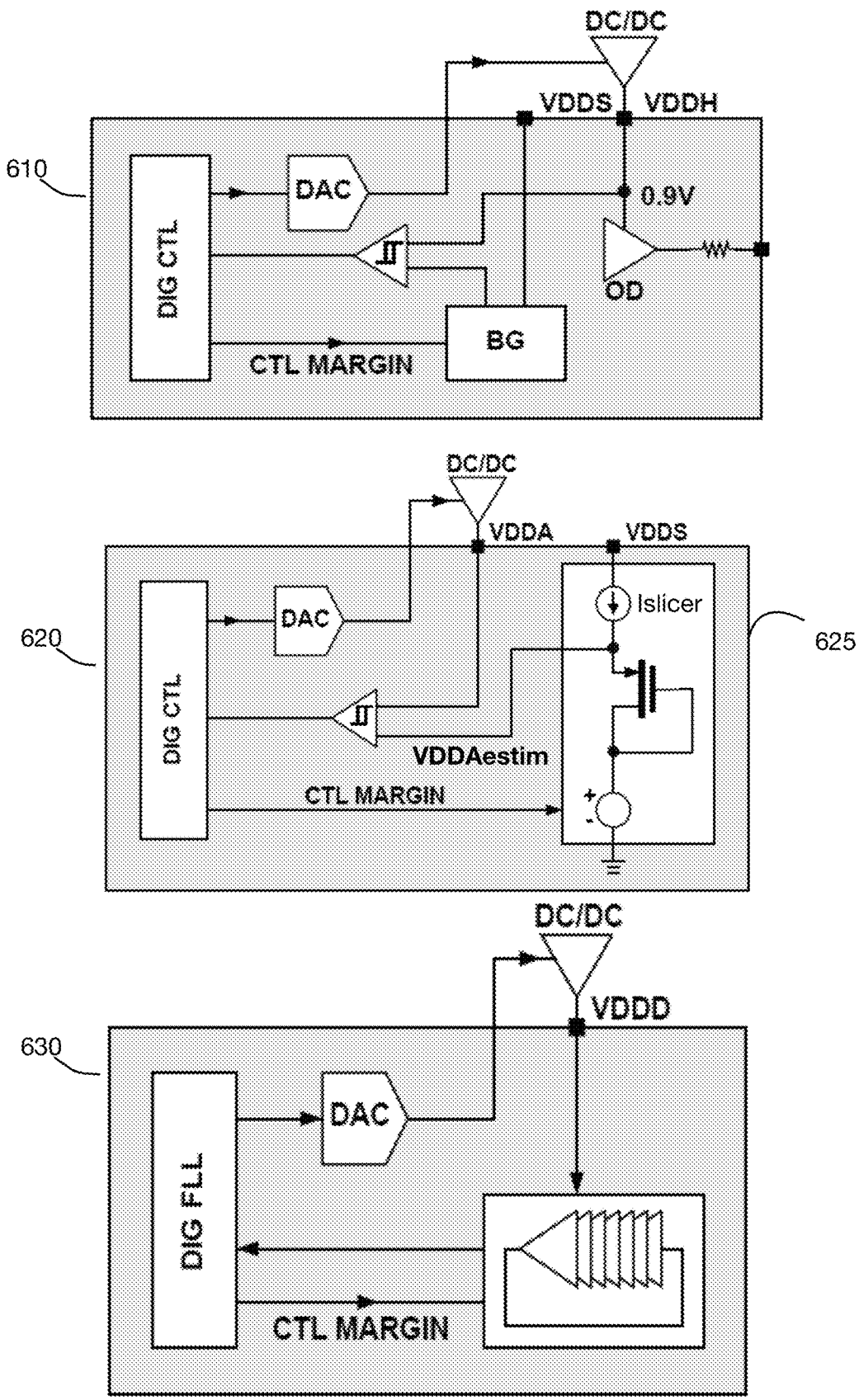
FIG. 6 shows additional examples of subsystems having critical subsystems measured and power controlled.
Figure 21:
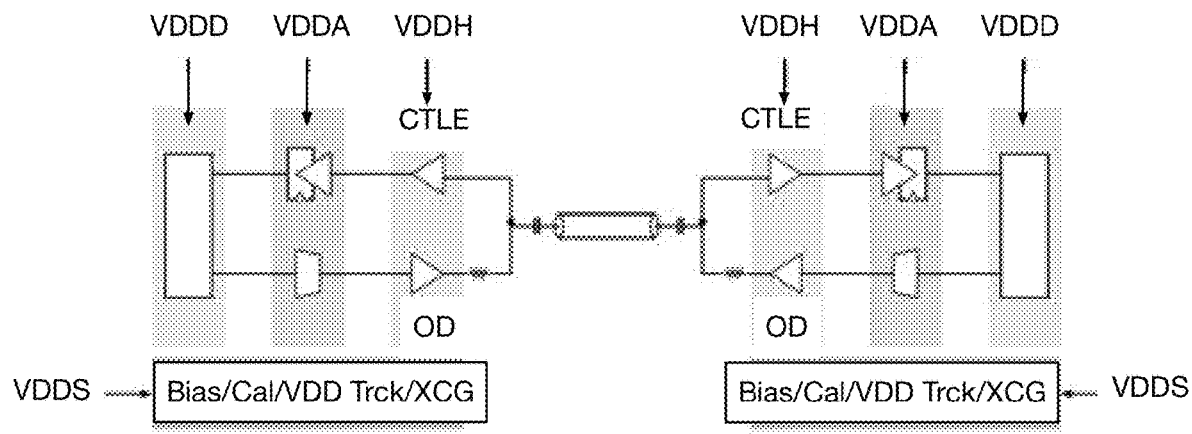
FIG. 21 is a block diagram of transmitting and receiving instances, each utilizing four distinct power sources.

FIG. 6 shows additional examples of power control domains and exemplar testable critical path subsystems. 610 shows power supply voltage VDDH (VDD High) being regulated externally to 0.9 volts, providing power to an output driver required to meet certain output criteria. 620 similarly shows power supply voltage VDDA (VDD Analog) being regulated in response to direct measurement of transistor threshold voltage. 630 shows VDDD (VDD Digital) being regulated to guarantee reliable operation of a high speed digital circuit, illustrated as a ring oscillator without implying limitation. In each illustrated example, the safety and measurement tolerance control margins described in FIG. 5 are applied within the measurement and control loops shown. Similarly, FIG. 21 shows a system utilizing separate VDD Analog, VDD Digital, VDD High, and VDD Support power sources.

Figure 7:
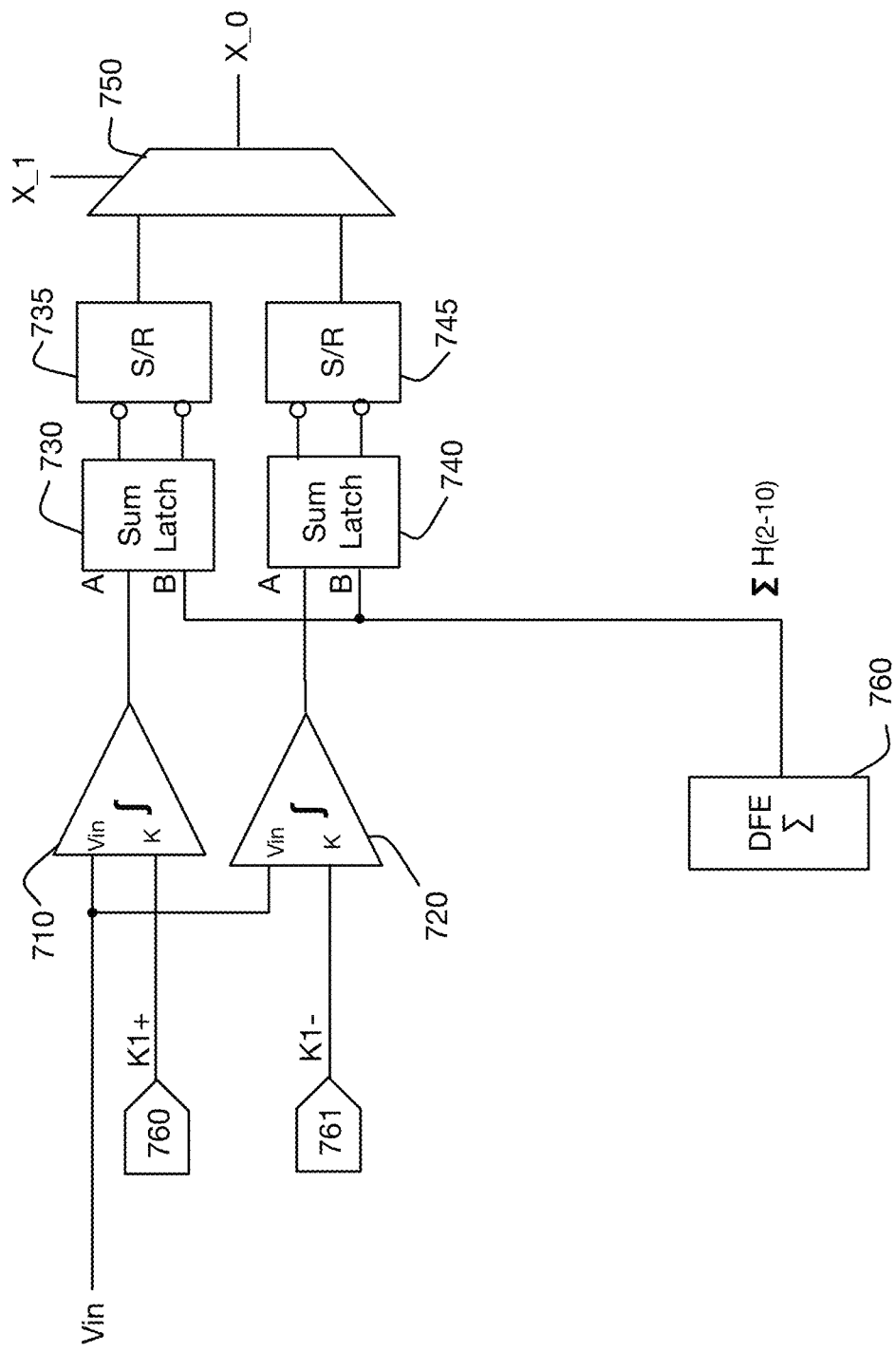
FIGS. 7-11 are block diagrams of various test environments in a data receiver, in accordance with some embodiments.

FIG. 7 is a block diagram of an exemplary test circuit in a receiver embodiment drawn from [Tajalli I] incorporating clocked integrators 710 and 720 and multi input summation latches 730 and 740 into each speculative data sampling path for K1+ and K1−. As with the embodiment of FIG. 2, power may be reduced by decreasing supply voltage provided to the integrators and the multi input summation latches, with a resultant increase in timing delay between a clock edge initiating sampling, and output of a valid data result through, as one example path, 710, 730, 735, 750.

Figure 8:
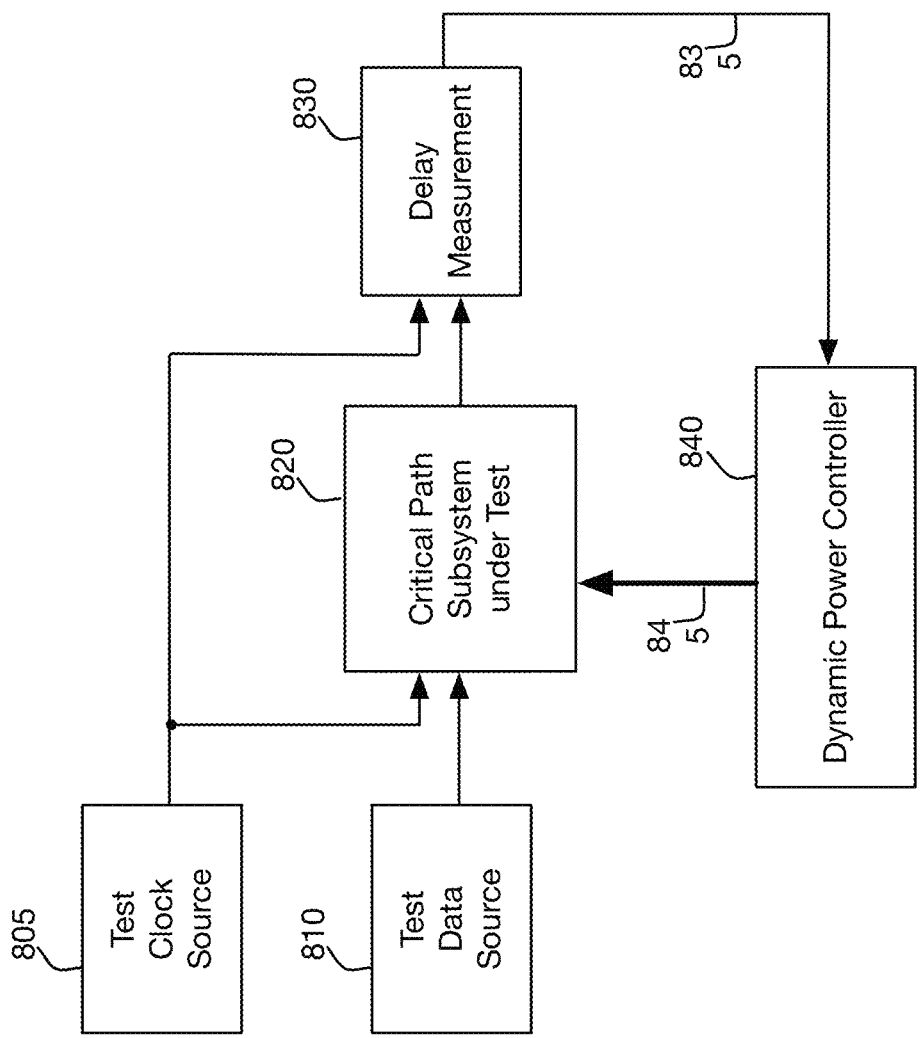

FIG. 8 is a block diagram of an alternative test environment, in which such a timing constrain is measured directly, rather than indirectly confirming the result of such correct timing (i.e. valid data results) were obtained. A test clock source 805 is applied to Critical Path Subsystem under test 820 along with a test data source 810. Delay measurement 830 receives the output of 820 and measures its processing delay relative to the initiating test clock. If the delay is within acceptable bounds, Dynamic Power Controller 840 may be instructed 835 to decrease supply voltage; if the delay is unacceptable, voltage may be similarly increased.

In some embodiments, Delay Measurement 830 may include a Delay Locked Loop, Time-to-Voltage converter such as a ramp and sample circuit, or go/no-go comparison against a fixed or previously configured time delay reference.

Figure 9:
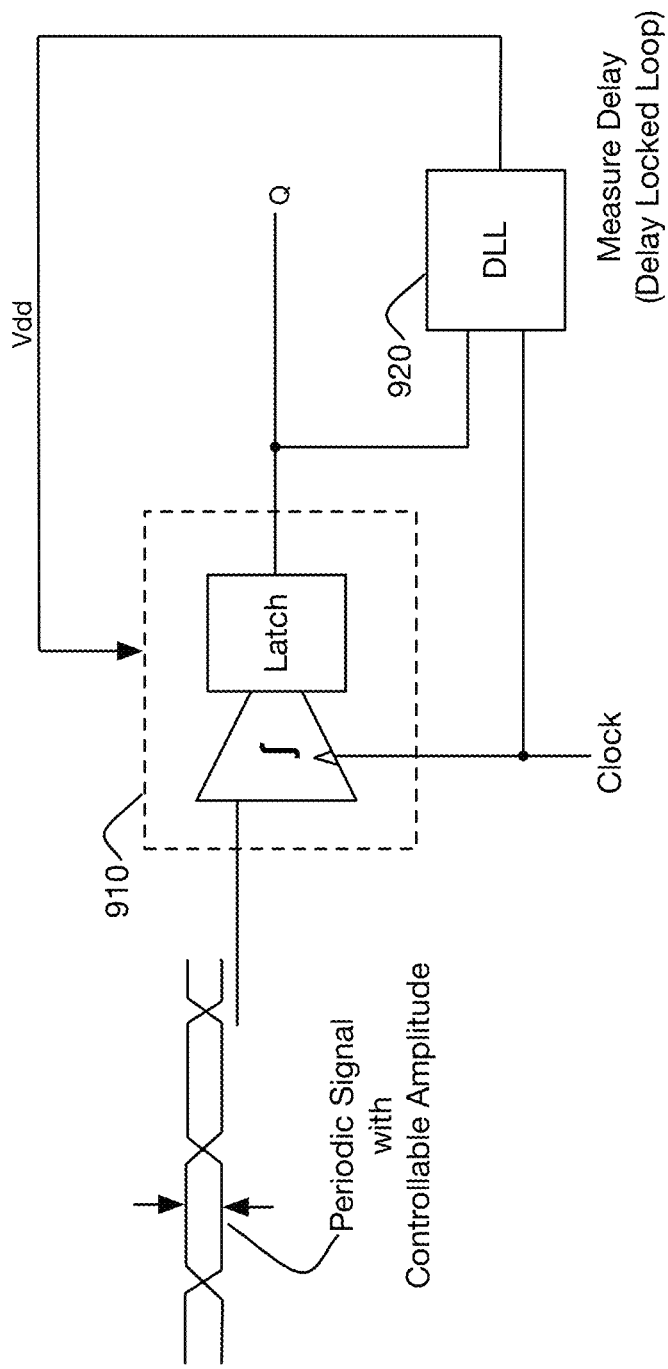

FIG. 9 illustrates a test environment based on a receiver drawn from [Tajalli I]. The data sampling element 910 includes a clocked integrator and multi input summation latch. As with the embodiment of FIG. 2, power may be reduced by decreasing supply voltage, with a resultant increase in timing delay between sampling clock edge and result output Q. In FIG. 9 this timing delay is measured by Delay Locked Loop 920, which is illustrated as controlling supply voltage Vdd to 910.

Figure 10:
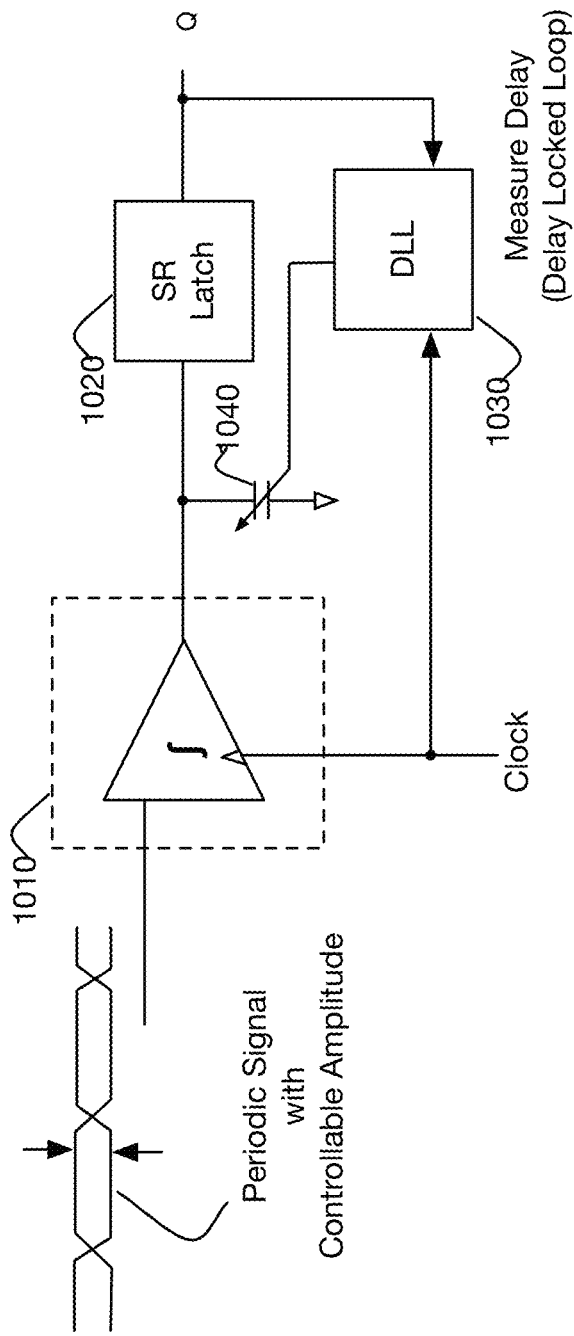

FIG. 10 shows another alternative data receiver embodiment. A configurable or adjustable capacitive load 1040 is shown between clocked integrator 1010 and Set/Reset Latch 1020. DLL 1030 compares the timing of output result Q with the sampling Clock, with its measurement result modifying 1040.

As described with respect to the previous figure, DLL 1030 measures the clock-to-Q processing delay, in this example through elements 1010 and 1020, including the loading effect of 1040. As detected by 1030, measured delays less than the desired amount result in an increased value for 1040, and measured delays greater than the desired amount result in a decreased value for 1040. These measurements and component adjustments may be performed independent of, or in combination with the previously described supply voltage adjustments.

Figure 11:
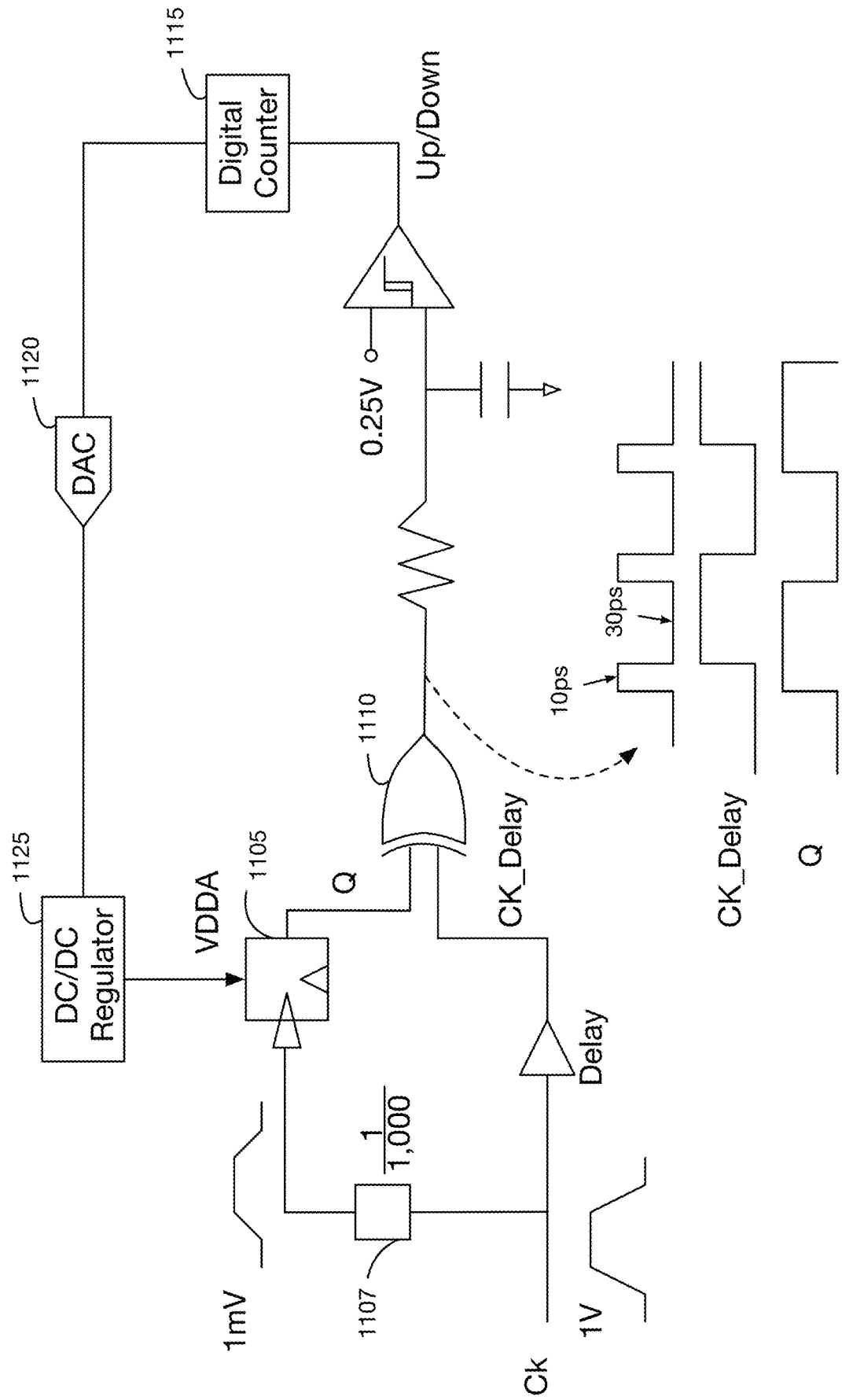

FIG. 11 is a block diagram of a test environment, in accordance with some embodiments. As shown, FIG. 11 may include a replicated sampling element 1105 similar to the data sampling element depicted in [Tajalli I]. In some embodiments, a periodic test signal may be applied to the input of the replica sampling element 1105. The periodic test signal may be produced from the sampling clock CK, or other periodic control rate signal generator, via a suitably configured signal attenuator. In such an embodiment, the periodic test signal may be generated by attenuating 1107 the sampling clock and applying the periodic test signal to the replica sampling element 1105. The exact amount of attenuation may depend on a desired sensitivity. In one non-limiting example, if the periodic test signal is tested to detect at 1 mV, then the sampling clock may be attenuated by a factor of 1000 to generate the periodic test signal to apply to the replica slicer.

The replica sampling element 1105 may sample the periodic test signal to produce a periodic output Q, having some amount of introduced signal delay value. A phase detector may be configured to measure the delay between the sampling clock and the output Q of replica sampling element 1105. As shown, a delay element is included in FIG. 11 to produce a delayed version of sampling clock CK_Delay. Such embodiments may ensure that the periodic test signal is sampled after a transition, rather than right on an edge of the transition. In some embodiments, an XOR phase detector 1110 is used, and the output of the phase detector may be proportional to XOR(CK, Q). In one non-limiting example, the clock period is 80 ps, and the clock-to-Q delay at 1 mV is designed to be no more than 60 ps. In such a scenario, the clock-to-Q output of the XOR phase detector will be 20 ps HIGH, and 60 ps LOW under the lock condition (shown in FIG. 11 as two lops segments and two 30 ps segments), e.g., a 25% duty cycle. In FIG. 11, the duty cycle may be set by a programmable sensitivity voltage $V_{sense}$, e.g. 0.25V in FIG. 11. It should be noted that $V_{sense}$ may be predetermined according to desired sensitivity, taking into account factors such as process variation, and dynamically updated due to temperature variation and aging. In some embodiments, $V_{sense}$ may be 0.5V. If such a condition is not met, then the switching regulator generating VDDA may be incrementally increased or reduced until the desired clock-to-Q delay value is reached. In FIG. 11, the output of the phase detector 1110 may be filtered via a loop filter and sliced against a reference voltage to provide increment up/increment down signals to a digital counter 1115. The test circuit may analyze the duty cycle of the clock-to-Q measurement to determine if the supply voltage VDDA provided to the sampling element 1105 needs to be increased or decreased. The digital counter 1115 maintains an average of the up/down increment signals and controls a digital-to-analog converter 1120 to adjust the supply voltage VDDA via the DC/DC regulator 1125.

Hierarchical Dynamic Voltage Scaling System

Figure 14:
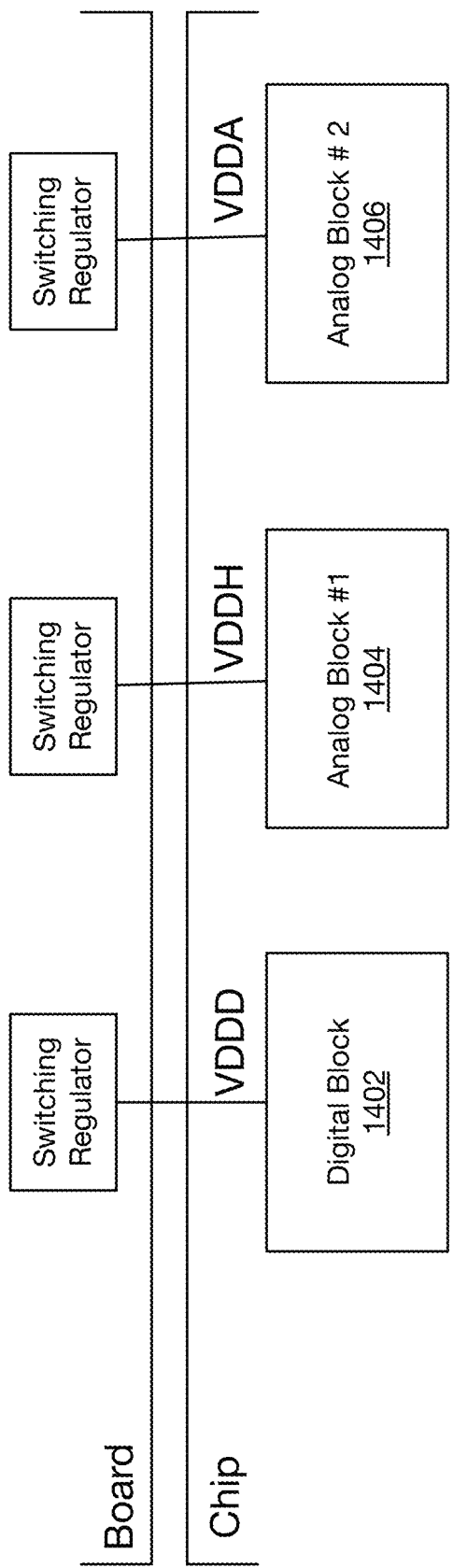
FIG. 14 is a block diagram of a hierarchical dynamic voltage scaling system, in accordance with some embodiments.

FIG. 14 is a block diagram of a hierarchical dynamic voltage scaling system, in accordance with some embodiments. As shown, the hierarchical dynamic voltage scaling system includes a digital circuit block 1402 and two analog blocks 1404 and 1406. Each of the digital and analog circuit blocks are connected to respective switching voltage regulators located on a printed circuit board (PCB) and may include mission-mode circuits that are grouped according to various factors. In at least one embodiment, each circuit block includes mission-mode circuits grouped at least in part according to voltage supply requirements over a plurality of test corners. Such supply requirements may be quantized as voltage-scaled trendlines for each mission-mode circuit in the group of mission-mode circuits. The voltage-scaled trendlines may correspond to an analysis of each circuit over various process/variation corners that determine how much a supply voltage can be scaled down to save power, while maintaining sufficient circuit sensitivity. In other embodiments, these trendlines may correspond to such analysis specific to the particular process characteristics of one integrated circuit device. Similarly, in some embodiments such analysis may be performed over all anticipated operating temperatures, and in other embodiments the analysis may be specific to the present operating temperature. In FIG. 14, the digital circuit block 1402 is connected to switching voltage regulator producing supply voltage VDDD, analog circuit block 1404 is connected to switching voltage regulator producing supply voltage VDDH, and analog circuit block 1406 is connected to switching voltage regulator producing supply voltage VDDA. In the following examples, it is assumed that the analog and digital circuit blocks on the chip have control of the three off-chip switching voltage regulators.

Figure 15:
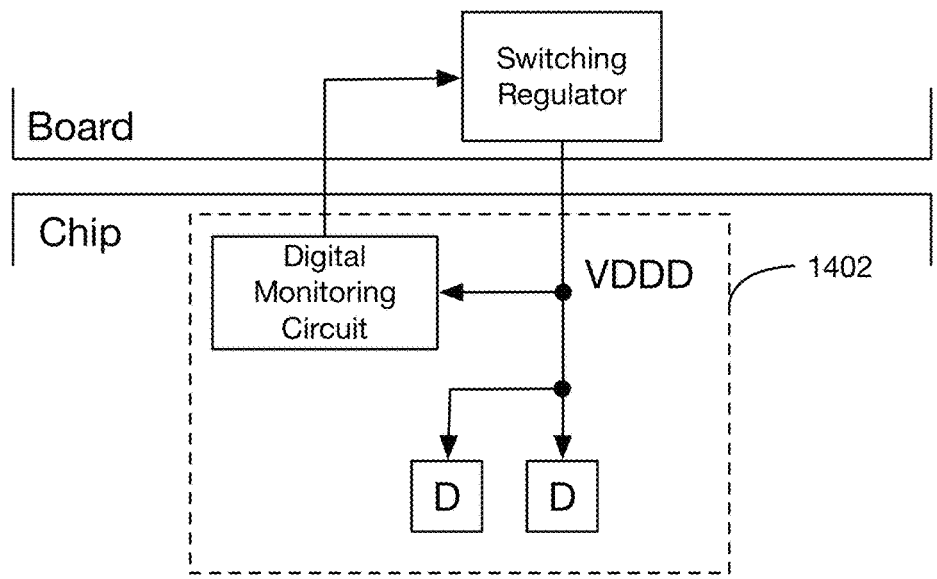
FIG. 15 is a block diagram of a digital circuit block incorporating dynamic voltage scaling, in accordance with some embodiments.

FIG. 15 is a block diagram of the digital circuit block 1402 of the hierarchical dynamic voltage scaling system, in accordance with some embodiments. As shown in FIG. 15, the digital circuit block 1402 includes multiple circuit blocks 'C', which may correspond to various digital circuits used in a transceiver system. For instance, digital circuit 'D' may take the form of a ring oscillator, among various other types of digital circuits. As shown, each digital circuit is configured to receive voltage VDDD from the switching voltage regulator. FIG. 15 further includes a digital monitoring circuit configured to receive VDDD. In some embodiments, the digital monitoring circuit is composed of a digital circuit corresponding to a copy of one of the digital circuits 'D'. In some embodiments, the digital monitoring circuit is a copy of the most sensitive circuit of the plurality of digital circuits 'D'. In at least one embodiment, the digital monitoring circuit is a ring oscillator circuit composed of e.g., CMOS inverters. In such an embodiment, the ring oscillator circuit receives voltage VDDD from the switching voltage regulator and operates at a corresponding frequency. The digital monitoring circuit may use a frequency detector to analyze the output of the ring oscillator circuit and may responsively provide a control signal to the switching voltage regulator to either increase or decrease VDDD. In some embodiments, process variation and/or temperature variation may cause slight differences in ring oscillator operation between different chips, and such a dynamic digital voltage scaling circuit 1402 may monitor itself to reduce power consumption. Furthermore, aging may cause circuit elements to slow down, and thus ensuring the digital monitoring circuit is operational in the margin depicted by the vdda max and vdda min curves accounts for such variations over time.

Figure 18:
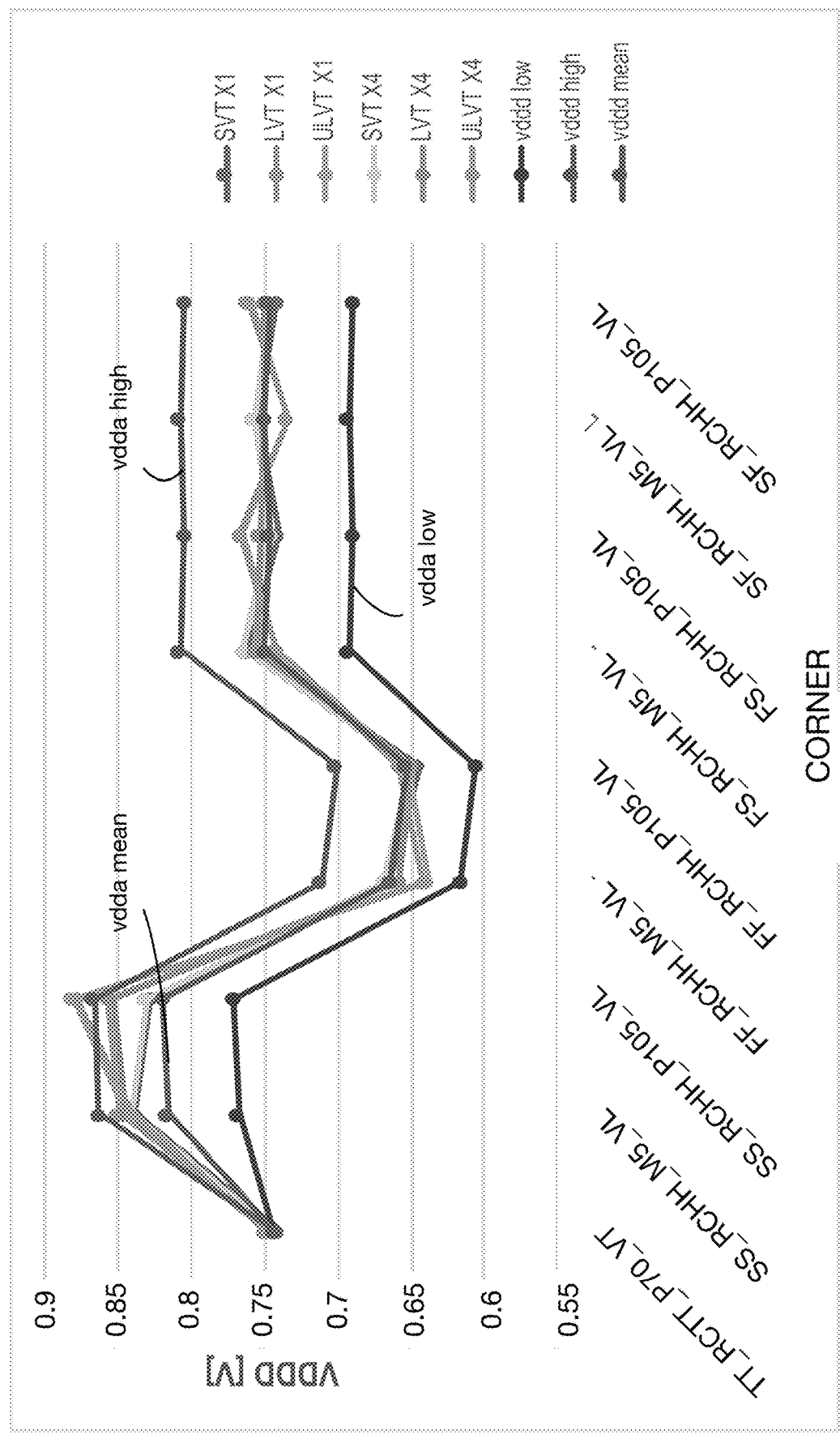
FIG. 18 is a graph illustrating voltage-scaled trend lines of a digital monitoring circuit used in the digital circuit block, in accordance with some embodiments.

FIG. 18 is a graph of voltage-scaled trend lines of a plurality of variations of a ring oscillator over various corners in accordance with some embodiments. In FIG. 18, the ring oscillator is simulated to generate voltage-scaled trend lines for standard V threshold (SVT) transistors, low Vt (LVT) transistors, and ultra-low Vt (ULVT) transistors. Furthermore, for each type of transistor, the ring oscillator is further simulated according to small-width transistors (X1) and large-width transistors (X4). The six monitoring circuit curves correspond to voltage-scaled trend lines that define supply voltages VDDD at each corner that significantly reduce power consumption while maintaining sufficient circuit performance and sensitivity. The 'vdda max' and 'vdda min' curves illustrate the margin for which the digital monitoring circuit reliably operates. By maintaining the dynamically scaled voltage VDDD above the 'vdda min' curve at each corner, the monitoring circuit (and thus each digital circuit 'D') will operate at a reliable performance. Furthermore, by maintaining the dynamically-scaled voltage VDDD below the 'vdda max' curve, the digital monitoring circuit consumes power that is less than a predetermined threshold. In some embodiments, generating the 'vdda max' curve and 'vdda min' curve may be done by manually adjusting the supply voltage provided to the digital monitoring circuit and observing the output and power consumption of the digital monitoring circuit. In circuit runtime, however, the circuit may be configured to analyze VDDD and to periodically adjust VDDD via a control signal provided to the switching voltage regulator as described above.

Figure 16:
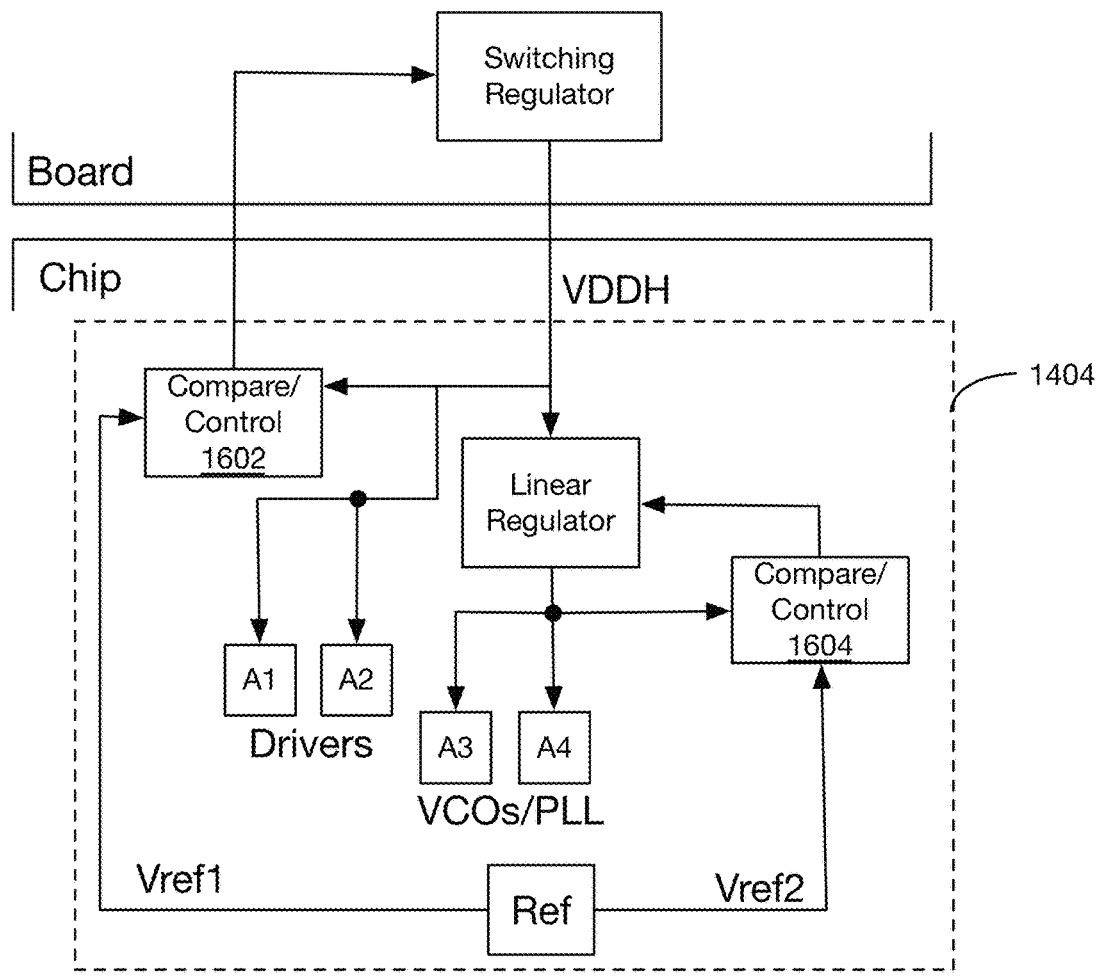
FIG. 16 is a block diagram of an analog circuit block incorporating a bandgap reference voltage generator to control a local regulator, in accordance with some embodiments.

FIG. 16 is a block diagram of an analog circuit block 1404, in accordance with some embodiments. The analog circuit block 1404 may include a block of analog mission-mode circuits that may be composed of circuits such as drivers, voltage-controlled oscillators (VCOs), and phase-locked loops (PLLs). In some embodiments, the mission-mode circuits 'A1-A4' may be grouped according to supply voltage requirements over a plurality of test corners. Voltage-scaled trendlines such as those shown in FIGS. 18-20 may assist in performing such groupings. The set of mission-mode circuits may include circuits that are not as sensitive to process variation as compared to the digital circuits described above and more sensitive analog circuits such as slicers described below. As shown, analog circuit block 1404 includes a set of analog mission-mode circuits 'A1' and 'A2' connected directly to VDDH, and a set of analog circuits 'A3' and 'A4' connected to a local on-chip linear regulator. The number of analog mission-mode circuits 'A1-A4' shown is purely illustrative and should not be considered limiting in any way. Such a hierarchical analog circuit block 1404 may be beneficial if not all analog circuits 'A1-A4' in the analog circuit block 1404 require the large VDDH voltage provided by the switching voltage regulator. In some embodiments, the analog circuits 'A1' and A2' connected to VDDH may be output drivers that utilize large voltages to drive signals onto a bus, while the analog circuits A3' and A4' connected to the linear regulators may be voltage-controlled oscillators (VCOs) or phase-locked loop (PLL) circuits that utilize smaller voltages. In some embodiments, the linear regulators may also provide low-noise supply voltages to more sensitive circuits. Analog circuit block 1404 further includes two compare-control circuits 1602 and 1604 connected to a reference voltage generator REF configured to generate one or more reference voltages. As shown, compare/control circuit 1602 is connected directly to VDDH, while compare-control circuit 1604 is connected to the linear regulator. In some embodiments, the compare-control circuit 1602 is configured to receive VDDH and a reference voltage Vref1 from the bandgap reference generator Ref, and to responsively provide a control signal to the switching regulator to align VDDH to the voltage provided by the bandgap reference generator Ref. Similarly, compare-control circuit 1604 is configured to receive a voltage from the linear regulator and a separate reference voltage Vref2, to responsively compare the voltage received from the linear regulator to Vref2, and to responsively provide a control signal to the linear regulator to align the linear regulator voltage to Vref2.

Such compare-control monitoring circuits in FIG. 16 may be useful in accounting for "IR" drop that may occur to process variation, temperature variation, and aging. In FIG. 16, any resistance in the traces connecting the analog mission-mode circuits 'A1-A4' to their respective voltage regulators may cause a voltage drop between the regulator and the analog circuit due to the current running through the trace (V=IR). Thus, the compare-control circuits may analyze the output of their respective voltage regulators (after experiencing a similar IR drop), and may control to regulators to increase or decrease voltage so that the desired voltage is seen at the monitoring circuit and is thus seen at the operational analog circuits 'A1-A4'.

Figure 17:
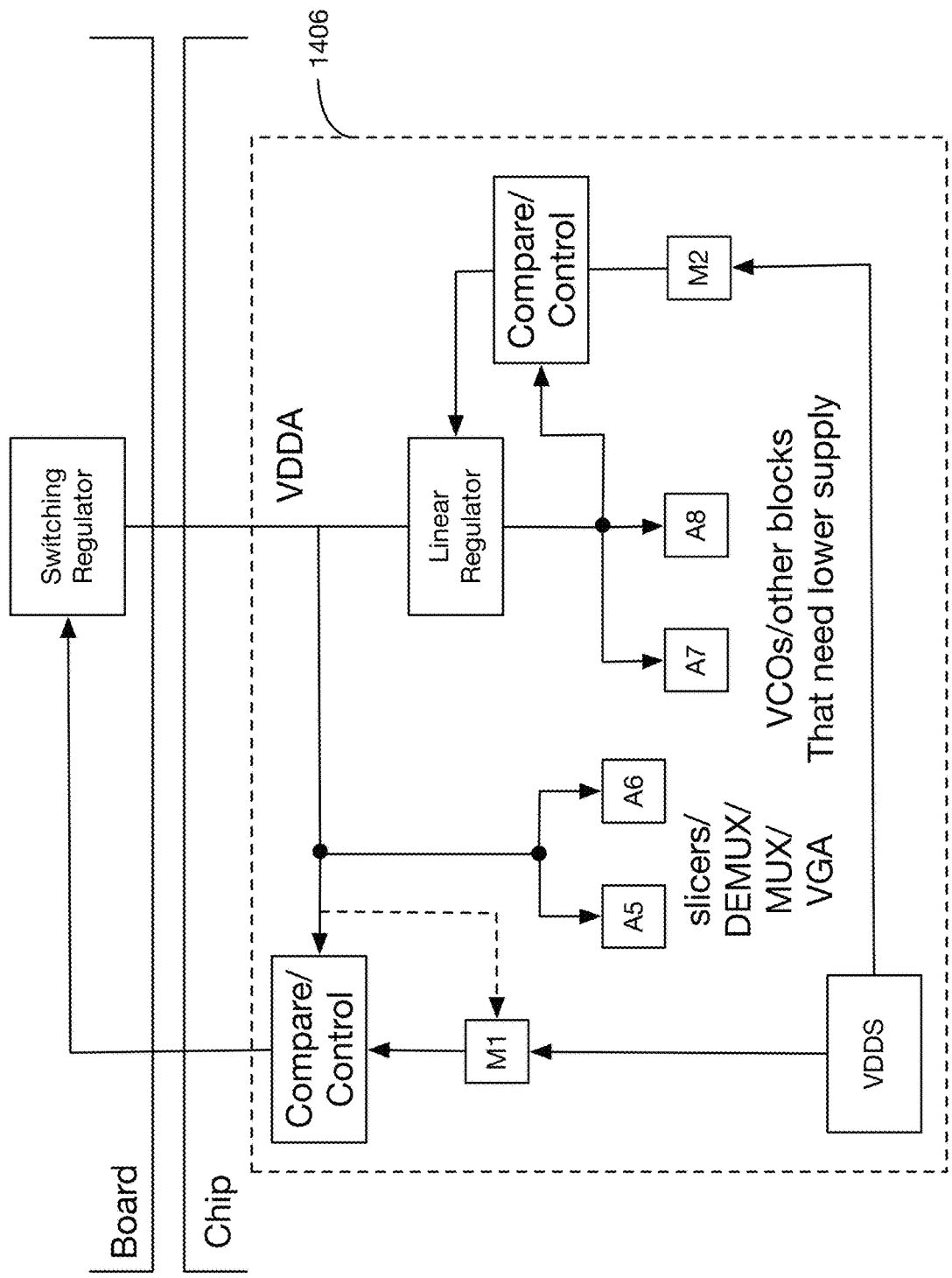
FIG. 17 is a block diagram of an analog circuit block incorporating dynamic voltage scaling, in accordance with some embodiments.

FIG. 17 is a block diagram of an analog circuit block 1406 utilizing dynamic voltage scaling, in accordance with some embodiments. Similar to the analog circuit block 1404 FIG. 16, analog circuit block 1406 includes at least one on-chip linear regulator for scaling VDDA received from the off-chip switching voltage regulator. As shown in FIG. 17, the analog circuit block 1406 includes analog mission-mode circuits 'A5-A8', that may include e.g., slicers, demultiplexers (DE-MUXs), multiplexers (MUXs), and variable-gain amplifiers (VGAs). Further, the analog circuit block 1406 includes monitoring circuits 'M1' and 'M2' connected to respective compare-control circuits to adjust respective voltage regulators. In some embodiments, the analog mission-mode circuits 'A5' and A6' connected to VDDA may include analog circuits such as slicers, DEMUXs, MUXs, and VGAs, while the analog mission-mode circuits 'A7' and 'A8' connected to the on-chip linear regulator include VCOs and other analog blocks that utilize lower supply voltages than VDDA.

In some embodiments, the monitoring circuit 'M1' may correspond to a slicer circuit path due to the slicer having the most critical path in that particular analog circuit block. Thus, ensuring that the slicer operates correctly will ensure that all other analog circuits 'A5' and 'A6' connected to VDDA in that analog circuit block are also operating correctly. It should be noted that in some embodiments, a monitoring circuit may be configured to measure a plurality of critical circuit paths in addition to the slicer. In such embodiments, a combination of the outputs may be used to control the switching regulator (or the local linear regulator). Such dynamic adjustment may occur responsive to e.g., temperature variation. A particular first critical circuit path may be more sensitive to lower temperatures, and measurements of such a critical circuit path may be selected to provide a control signal while operating temperatures are low. Furthermore, a second critical circuit path may be more sensitive at higher temperatures and measurements of the second critical circuit path may thus be chosen to generate the control signal for updating the corresponding voltage regulator. In some embodiments, the selection between the first and second critical circuit paths within the monitor circuit may be dynamically performed by selecting the worst-case critical path by comparing the required supply voltages for each critical path of the plurality of critical paths and selecting the highest required supply voltage, guaranteeing sufficient operation of the rest of the critical circuit paths.

In FIG. 17, monitoring circuit 'M1' may be a copy of a slicer corresponding to one of analog mission-mode circuits 'A5' and 'A6' and connected to VDDs. Such a monitoring circuit is shown in FIG. 6 as monitoring circuit 620. As shown in FIG. 6, monitoring circuit 620 includes copy slicer 625. Copy slicer 625 is configured to receive a fixed current (Islicer) produced via VDDS, which may be some external supply, e.g., a 3.3V supply, that is sufficient for a good representation of the desired slicer speed and sensitivity. An estimate of VDDA VDDAestim is produced internally via Islicer, which is compared to the real value of VDDA produced by the switching voltage regulator, and a control signal produced by DIG CTL comparing VDDA to VDDAestim is provided to the switching voltage regulator to adjust VDDA until VDDA matches VDDAestim. Such an embodiment may be easier to control compared to the type of monitoring circuit shown in FIG. 11.

In some embodiments, 'M1' and the compare-control circuit may correspond to the embodiment previously described with respect to FIG. 11. In such embodiments, 'M1' may be a copy of a slicer circuit used as e.g., analog circuit 'A5', receiving VDDA, represented in this particular embodiment by the dotted line. 'M1' may be configured to obtain a programmable sensitivity voltage (e.g., 0.25V) setting the desired sensitivity level from e.g., VDDS. 'M1' also obtains the supply voltage VDDA from the switching voltage regulator producing VDDA. In such an embodiment, the copy slicer 'M1' operates on a periodic test signal and is powered by the VDDA and the programmable sensitivity voltage to generate a control signal using a digital counter 1115 and a DAC 1120, the control signal provided to switching voltage regulator 1125 to update VDDA until the DC output of the comparison circuit matches the programmable sensitivity voltage.

In at least one alternative embodiment, the monitoring circuit may forego the copy slicer 1105, and may instead monitor the output of a "mission mode" slicer (e.g., analog circuit 'A5' could be the mission mode slicer). In such embodiments, the monitoring circuit 'M1' may include the delay element shown in FIG. 11, as well as XOR gate 1110, and may analyze the low-pass filtered output using the programmable sensitivity voltage set to achieve desired sensitivity.

Figure 19:
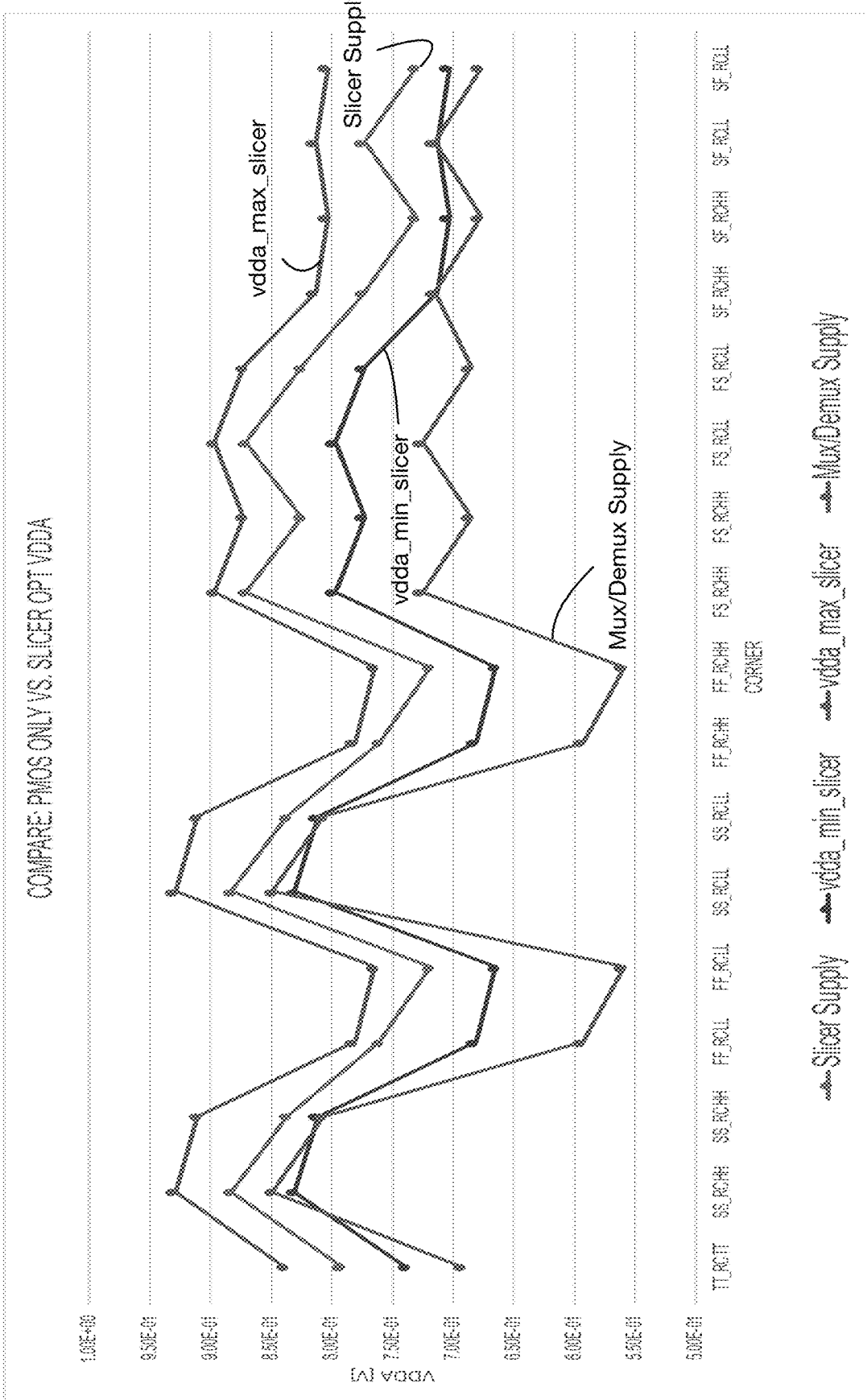
FIG. 19 is a graph illustrating voltage-scaled trend lines of a PMOS-only slicer and a Mux/Demux analog circuit used in an analog circuit block, in accordance with some embodiments.

FIG. 19 is a waveform diagram illustrating voltage-scaled trend lines of slicer (utilizing PMOS gates) and Mux/Demux monitoring circuits, in addition to the designed variation margin curves (the vdda_max_slicer and vdda_min_slicer curves). As previously described, the circuit operating in the most sensitive critical circuit path may be chosen as the monitoring circuit, which from FIG. 19 can be determined to be the slicer circuit. For any given corner along the voltage-scaled trend line, the slicer utilizes a higher supply voltage VDDA than Mux/Demux circuits, as indicated by the Mux/Demux voltage-scaled trendline, and thus the Mux/Demux voltage-scaled trendline conforms to the voltage-scaled trendline of the slicer. In some embodiments, "conforming" may mean that the voltage-scaled trend line of the most critical path indicates use of a higher supply voltage than any other circuit path in the associated circuit block. The Mux/Demux voltage-scaled trend line uses a lower supply voltage VDDA at any given corner than the slicer and is thus less sensitive. The monitoring circuit M2 may operate in a similar fashion and may include a copy of one or more of analog circuits 'A7' or 'A8', e.g., a VCO, and may provide a control signal to adjust the supply voltage of local linear regulator. If an intersection of the slicer and Mux/Demux monitoring circuits were to occur, then at any given operating condition either the measured performance of the slicer or Mux/Demux monitoring circuit could be used to adjust the supply voltage, depending on which measured performance required a higher supply voltage.

Figure 20:
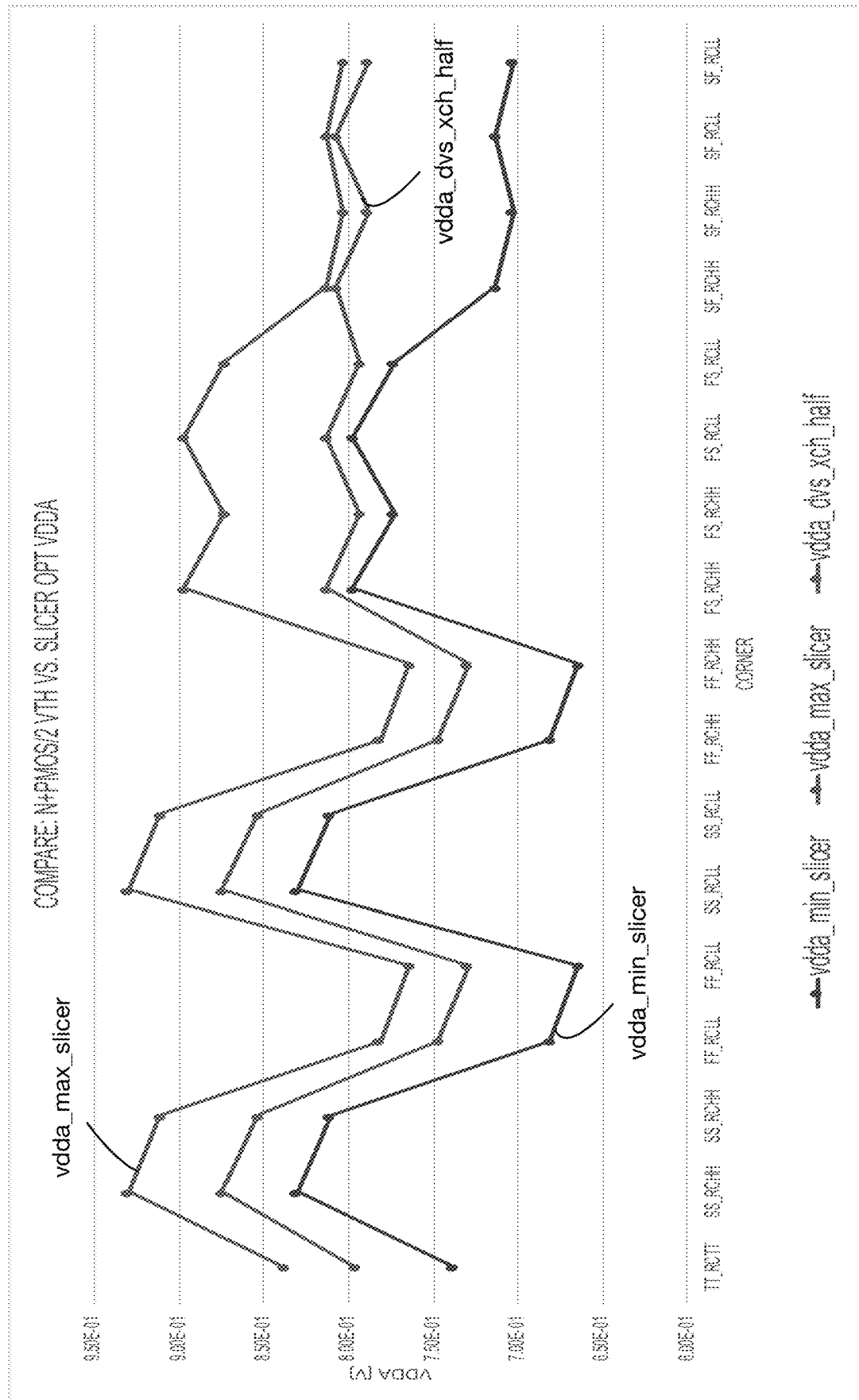
FIG. 20 is a graph illustrating a voltage-scaled trend line of a PMOS+NMOS slicer, in accordance with some embodiments.

FIG. 20 is a waveform diagram of a voltage-scaled trend line of a slicer using NMOS and PMOS circuits across various process corners e.g., fast-fast (FF), fast-slow (FS), slow-fast (SF), slow-slow (SS), and amongst high and low interconnection resistance (R) and capacitance (C) corners RCHH and RCLL, respectively. As shown, the voltage-scaled trend line conforms between the max and min slicer margin, only approaching the margins at the FF_RCHH, SS_RCHH, and SF_RCLL corners. As the PMOS-only slicer has a better-performing voltage-scaled trend line as illustrated in FIG. 19, the PMOS-only slicer may be preferred.

Figure 22:
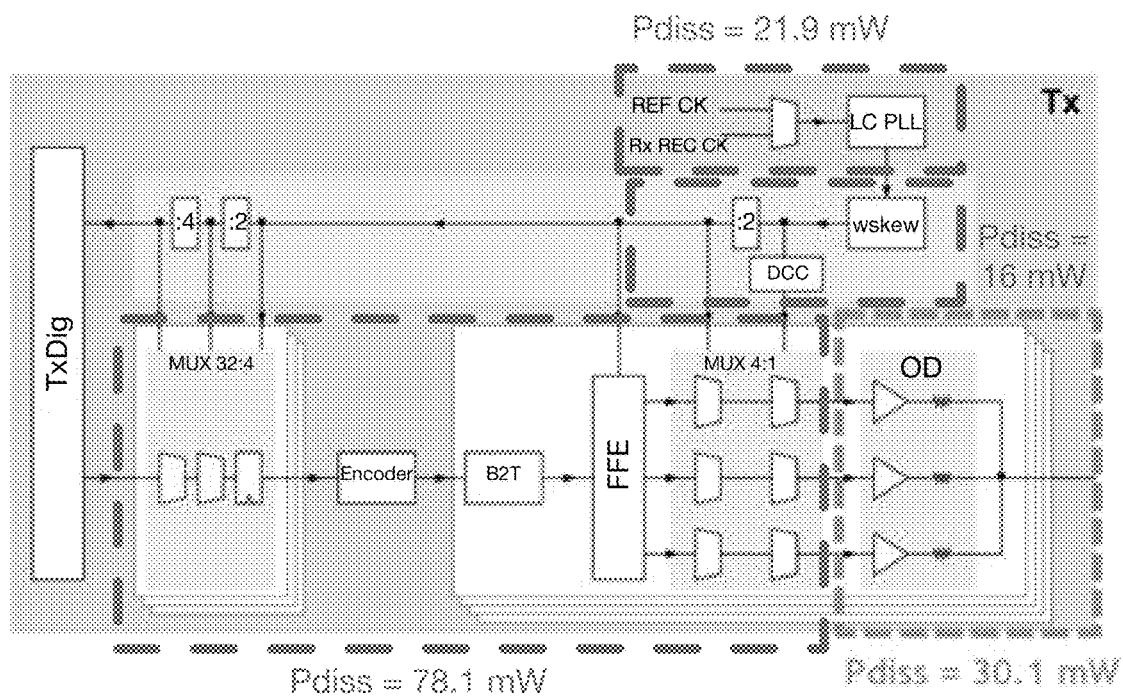
FIG. 22 is a system block diagram showing four subsystems having distinct power utilization profiles and operational characteristics.
Figure 23:
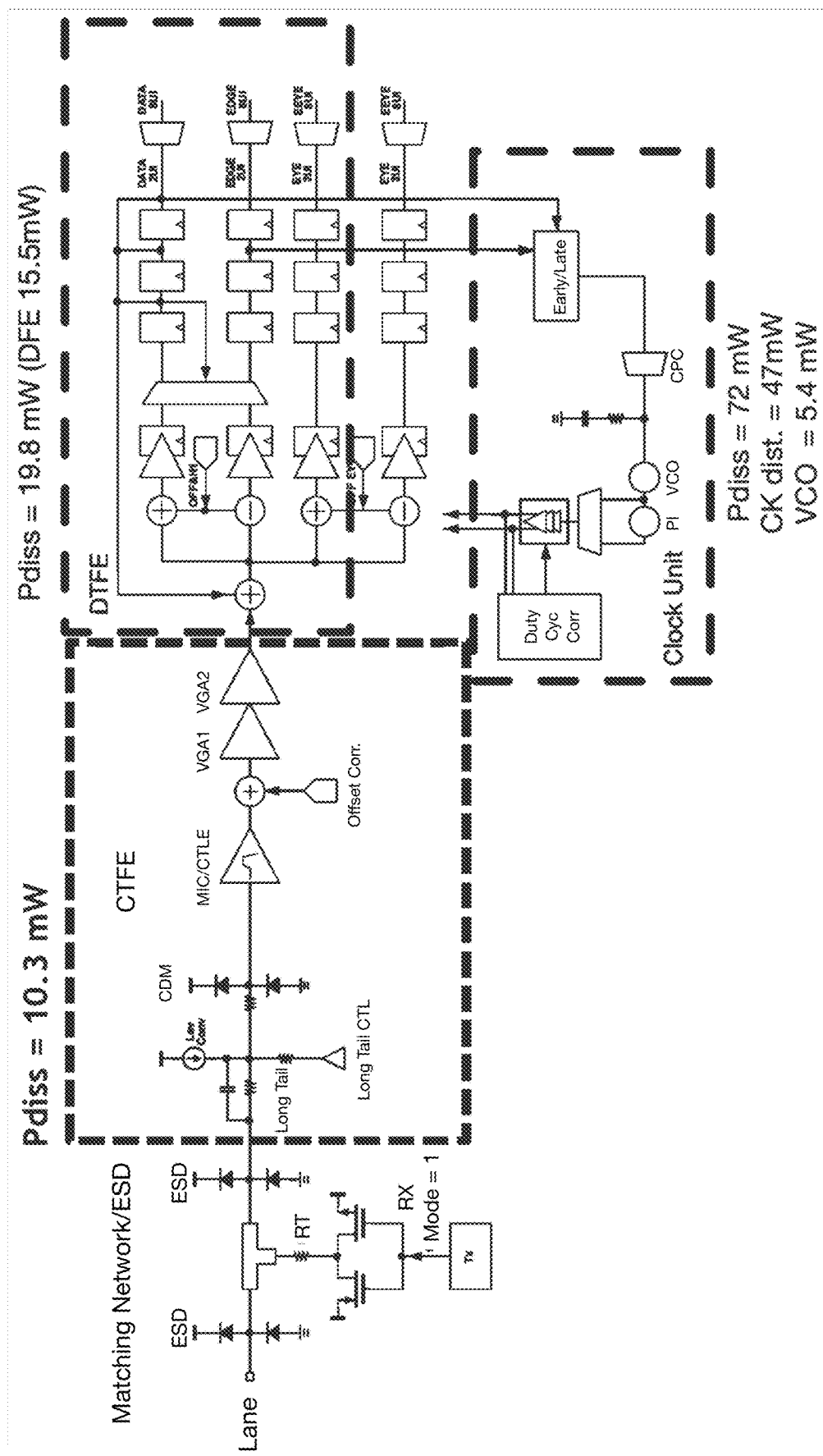
FIG. 23 is a system block diagram showing three subsystems having distinct power utilization profiles and operational characteristics.

When grouping circuits together as described in the above embodiments, several factors may be taken into account, including the magnitude of the supply voltage a given circuit uses, the voltage-scaled trend line of the circuit across various process corners and temperature corners (and potentially grouping circuits according to the most common/important corners), as well as what type of circuit it is (digital vs. analog). Examples of such grouping are illustrated in FIG. 22 and FIG. 23. Several other factors may be considered as well. As previously described, other embodiments may perform such analysis specific to the particular process characteristics of a specific integrated circuit instance. Further embodiments may additionally constrain supply voltage scaling considerations to a particular temperature. Voltage scaling adjustments may be performed continuously during normal operation, periodically during normal operation, periodically during interruptions of normal operation, or as part of a one-time initialization or start-up procedure.

Adjustment of supply voltage may be based on predetermined calculations incorporating expected process control variations across a statistically significant number of integrated circuit instances, or may be specific to the particular operational characteristics of a singular device. Such calculations may be done numerically, digitally, or in the analog domain. In some embodiments, said calculations may in whole or in part utilize precomputed elements read from one or more lookup tables.

In some embodiments, a monitoring circuit may be configured to measure circuit performance of a critical path and to responsively adjust the dynamically-adjusted supply voltage until the dynamically-adjusted supply voltage provides sufficient circuit operation. The monitoring circuit may be configured to apply a variation margin to the dynamically-adjusted supply voltage to ensure sufficient circuit operation across e.g., variation in temperature. The monitoring circuit may subsequently be turned off to save power. In some embodiments, the monitoring circuit may be re-enabled periodically to re-measure circuit performance in the critical path and may make further adjustments to the dynamically-adjusted supply voltage.

The variation margin may correspond to a fixed voltage to add onto the dynamically-adjusted supply voltage, e.g. 0.05-0.1V. Alternatively, the variation margin may be a percentage, e.g., an extra 10% of margin added to the dynamically-adjusted supply voltage once the measured circuit performance of the critical path has been deemed sufficient.

Figure 13:
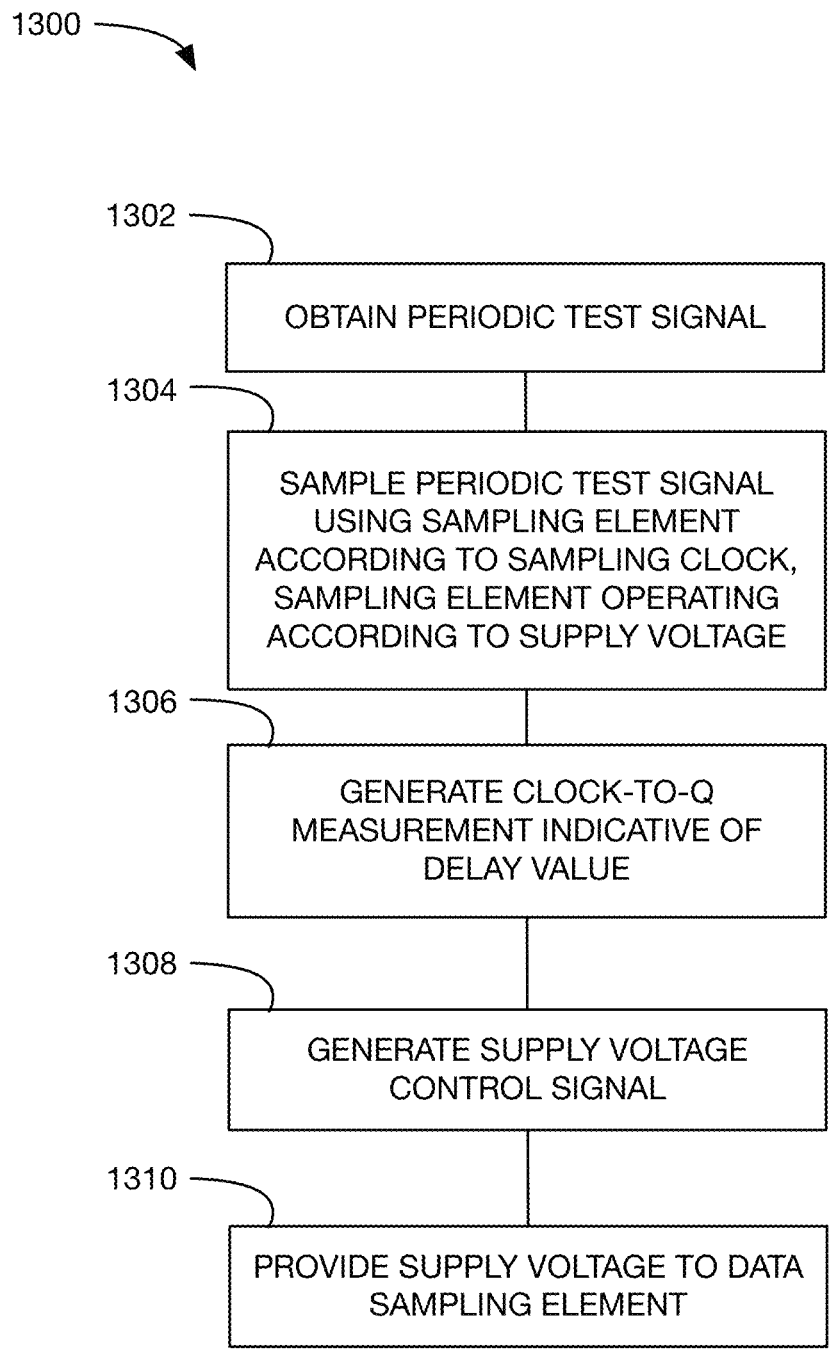
FIG. 13 is a flowchart of a method, in accordance with some embodiments.

FIG. 13 is a flowchart of a method 1300, in accordance with some embodiments. As shown, method 1300 includes obtaining 1302 a periodic test signal, and sampling 1304 the periodic test signal using a sampling element 1105 according to a sampling clock ck to generate a sampled periodic output Q, the sampling element 1105 operating according to a supply voltage VDDA provided by a voltage regulator 1125, the voltage regulator 1125 providing the supply voltage VDDA according to a supply voltage control signal. The sampled periodic output Q is compared 1306 to the sampling clock ck to generate a clock-to-Q measurement indicative of a delay value associated with the generation of the sampled periodic output Q in response to the sampling clock ck. The supply voltage control signal is generated 1308 based at least in part on an average of the clock-to-Q measurement, and the supply voltage is provided 1310 to a data sampling element (not shown) connected to the voltage regulator 1125, the data sampling element being a replica of the sampling element 1105, the data sampling element sampling a stream of input data according to the sampling clock.

In some embodiments, the periodic test signal is generated from the sampling clock. In such embodiments, the periodic test signal may be an attenuated version of the sampling clock. In some embodiments, the sampling clock has a delay with respect to the periodic test signal.

In some embodiments, generating the supply voltage control signal includes comparing the average of the clock-to-Q measurement to a predetermined operating threshold. In such an embodiment, the comparison may be performed by comparing a duty cycle of the clock-to-Q measurement to the predetermined operating threshold. In some embodiments, the predetermined operating threshold corresponds to a duty cycle of 25%.

Alternatively, comparing the average of the clock-to-Q measurement to the predetermined operating threshold may include comparing an average value of the clock-to-Q measurement to the predetermined operating threshold. In such embodiments, the predetermined operating threshold corresponds to an average value of 0.25.

In some embodiments, comparing the sampled periodic output to the sampling clock comprises performing a phase comparison between the sampled periodic output and the sampling clock. In such embodiments, the phase comparison is performed using an exclusive OR (XOR) phase comparator 1110. In some embodiments, the phase comparison is provided to a loop filter.

Figure 12:
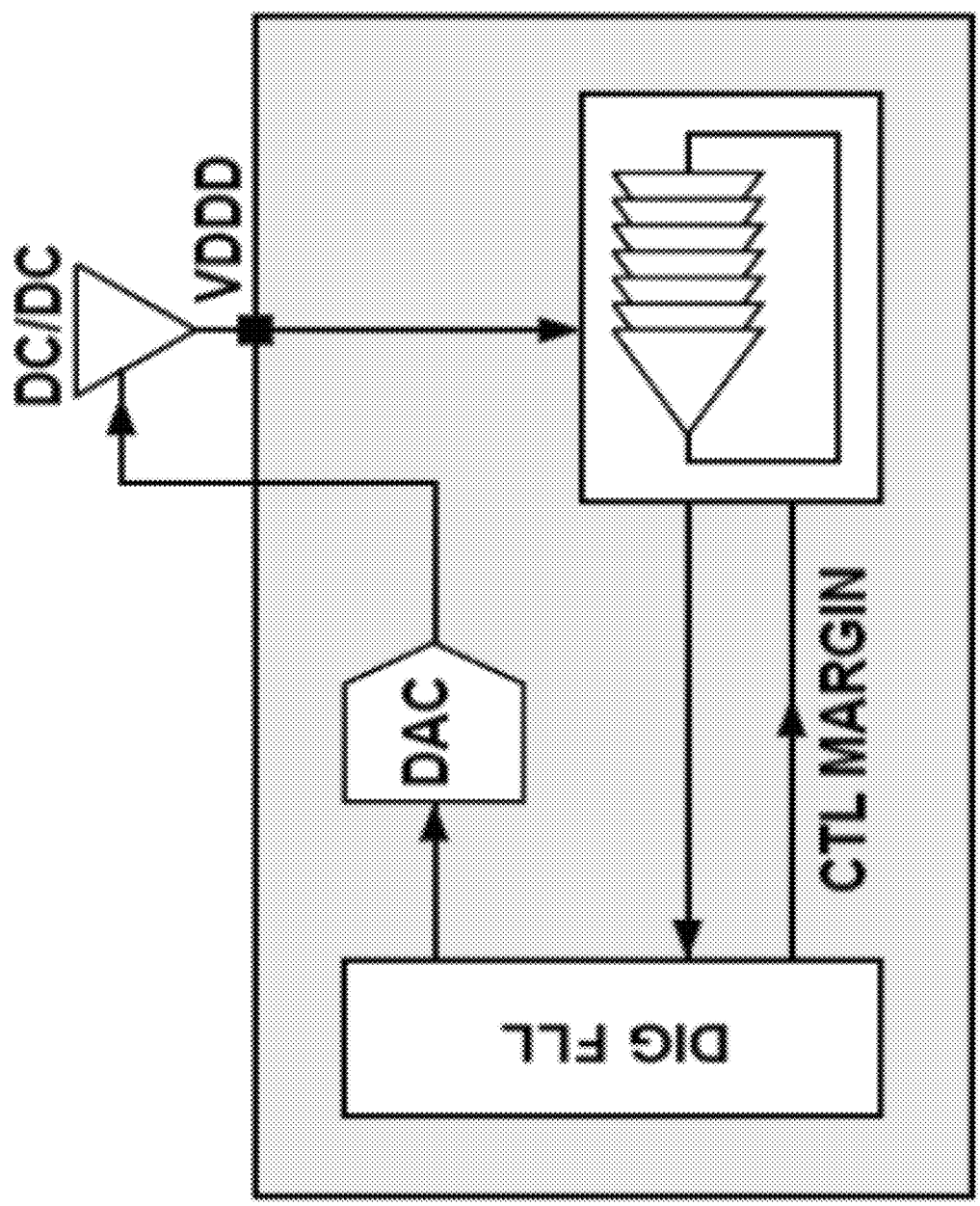
FIG. 12 is a block diagram of an apparatus for adjusting a supply voltage, in accordance with some embodiments.

In some embodiments, a digital block is used to control the supply voltage by measuring if the delay is too high or too low. If for a number of measurements the votes indicate that delay is high, then the digital unit will command a DAC to increase output voltage by one bit. The increase of DAC would mean an increase in the DC/DC converter. FIG. 12 illustrates such an embodiment used for filtering the votes and updating a DAC to adjust the power supply.

Figure 24:
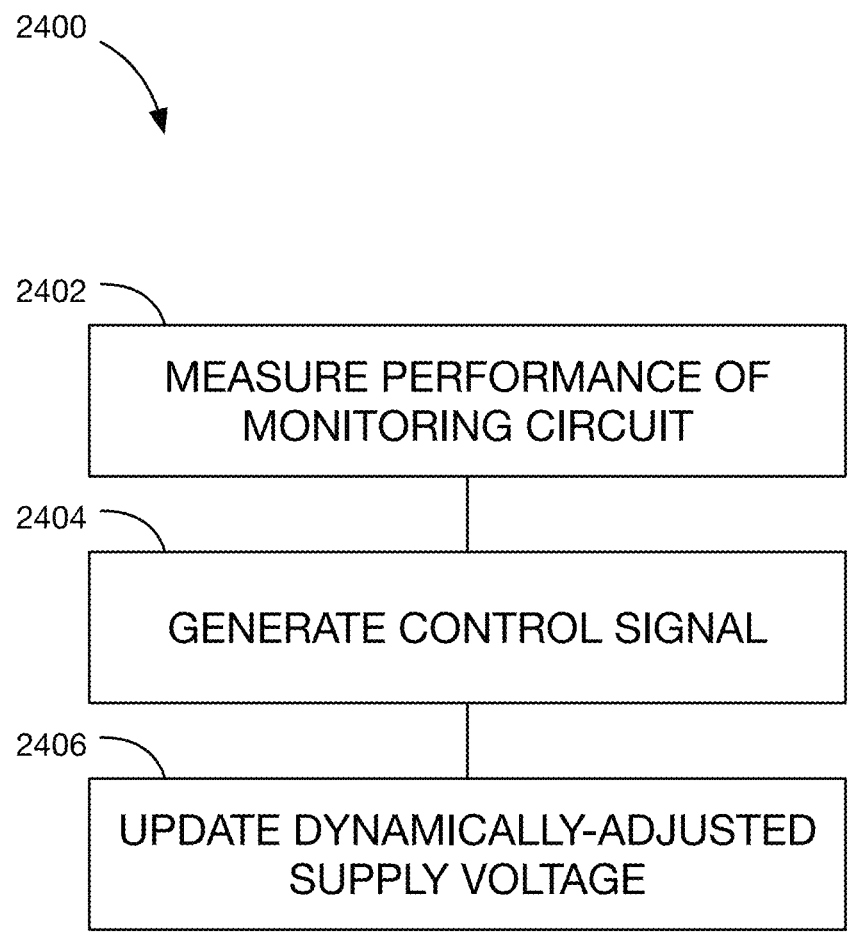
FIG. 24 is a flowchart of a method 2400, in accordance with some embodiments.

FIG. 24 is a flowchart of a method 2400, in accordance with some embodiments. As shown, method 2400 includes measuring 2402 performance of a monitoring circuit based on a dynamically-adjusted supply voltage of a respective switching voltage regulator, the monitoring circuit representative of a respective set of mission mode circuits operating in a transceiver signal processing path, the respective set of mission mode circuits grouped according to voltage supply requirements over a plurality of test corners. The method further includes generating 2404 a control signal based on the measured performance of the monitoring circuit and adjusting 2406 the dynamically-adjusted supply voltage of the respective switching voltage regulator based on the generated control signal.

In some embodiments, the measured performance of the monitoring circuit corresponds to a measurement of a critical circuit path in the set of mission-mode circuits. In some such embodiments, the critical circuit path corresponds to a worst-case-scenario critical circuit path of a plurality of critical circuit paths. The control signal may be dynamically generated based on the worst-case-scenario critical circuit path associated with a given operating condition. In some embodiments, the method further includes identifying the worst-case-scenario critical circuit path by comparing measured performances of the plurality of critical circuit paths.

In some embodiments, the method further includes providing the control signal to a control circuit that adjusts the dynamically-adjusted supply voltage of the respective switching voltage regulator. In some embodiments, the dynamically-adjusted supply voltage of the respective switching voltage regulator is further adjusted based on a variation margin. The variation margin may be a constant voltage component added to the dynamically-adjusted supply voltage of the respective switching voltage regulator. Alternatively, the variation margin may correspond to a percentage margin applied to the dynamically-adjusted supply voltage of the respective switching voltage regulator. In some embodiments, the performance of the monitoring circuit is periodically measured in response to changes in operating conditions.

I claim:

1. An apparatus comprising:
   a plurality of voltage regulators, each configured to generate a dynamically-adjusted supply voltage, comprising:
      a set of external switching voltage regulators comprising respective switching voltage regulators for at least two analog voltage domains, the set of external switching voltage regulators located off-chip;
      a local linear voltage regulator connected to a corresponding switching voltage regulator and configured to generate the dynamically-adjusted supply voltage for at least a portion of the analog voltage domain of the respective switching voltage regulator, the local linear voltage regulator located on-chip;
   a plurality of analog circuits subdivided into groups of analog circuits, the plurality of analog circuits grouped based on voltage supply requirements over a plurality of test corners, each group configured to receive one of the dynamically-adjusted supply voltages; and
   for each group of analog circuits, a corresponding monitoring circuit representative of said group of analog circuits, the corresponding monitoring circuit configured to provide a control signal indicative of a measured performance of said group of analog circuits, the control signal used in adjusting the received dynamically-adjusted supply voltage.

2. The apparatus of claim 1, wherein the measured performance of each monitoring circuit corresponds to performance of a critical circuit path in said group of analog circuits.

3. The apparatus of claim 2, wherein at least one monitoring circuit is configured to measure performance of a plurality of critical circuit paths in said group of analog circuits, and wherein the control signal is provided based on a measurement of a worst-case-scenario critical circuit path of the plurality of critical circuit paths.

4. The apparatus of claim 3, wherein the worst-case-scenario critical circuit path is associated with a corresponding test corner of the plurality of test corners.

5. The apparatus of claim 3, wherein the monitoring circuit is configured to determine the worst-case-scenario critical circuit path by comparing measured performances of the plurality of critical circuit paths.

6. The apparatus of claim 1, further comprising a control circuit configured to receive each control signal and to adjust the dynamically-adjusted supply voltages of the plurality of voltage regulators.

7. The apparatus of claim 1, wherein the set of external switching voltage regulators are configured to generate a VDDH dynamically-adjusted supply voltage associated with a VDDH analog voltage domain and a VDDA dynamically-adjusted supply voltage associated with a VDDA analog voltage domain.

8. The apparatus of claim 7, wherein a first group of analog circuits comprises output driver circuits configured to receive the VDDH dynamically-adjusted supply voltage, and wherein a second group of analog circuits comprises a voltage-controlled oscillator (VCO) and a phase-locked loop (PLL) configured to receive the dynamically-adjusted supply voltage from the local linear regulator, the local linear regulator configured to receive the VDDH dynamically-adjusted supply voltage.

9. The apparatus of claim 7, wherein a first group of analog circuits comprises a slicer, a demultiplexer, a multiplexer, and a variable gain amplifier (VGA) configured to received the VDDA dynamically-adjusted supply voltage, and a second group of analog circuits comprising a voltage-controlled oscillator (VCO) configured to receive the dynamically-adjusted supply voltage from the local linear regulator, the local linear regulator configured to receive the VDDA dynamically-adjusted supply voltage.

10. The apparatus of claim 9, wherein the corresponding monitoring circuit for the first group of analog circuits is configured to measure performance of a critical path associated with the slicer.

11. The apparatus of claim 7, wherein the set of external switching are configured to generate a VDDD dynamically-adjusted supply voltage associated with a digital voltage domain for a group of digital circuits.

12. The apparatus of claim 11, further comprising a digital monitoring circuit configured to monitor the performance of the group of digital circuits and to generate a control signal for updating the VDDD dynamically-adjusted supply voltage.

13. The apparatus of claim 12, wherein the group of digital circuits comprises a ring oscillator, and wherein the digital monitoring circuit comprises a frequency detector configured to analyze the output of the ring oscillator.

14. The apparatus of claim 1, wherein at least one monitoring circuit is further configured to operate according to a process-variation-and-temperature (PVT)-independent supply voltage VDDS.

15. The apparatus of claim 14, wherein VDDS is configured to set a sensitivity level of the at least one monitoring circuit.

16. A method comprising:
generating a plurality of dynamically-adjusted supply voltages using a plurality of voltage regulators, the plurality of voltage regulators comprising:
a set of external switching voltage regulators comprising respective switching voltage regulators for at least two analog voltage domains, the set of external switching voltage regulators located off-chip;
a local linear voltage regulator connected to a corresponding switching voltage regulator and configured to generate the dynamically-adjusted supply voltage for at least a portion of the analog voltage domain of the respective switching voltage regulator, the local linear regulator located on-chip;
measuring performance of a plurality of groups of analog circuits using corresponding monitoring circuits, the plurality of groups of analog circuits grouped based on voltage supply requirements over a plurality of test corners, each group receiving one of the dynamically-adjusted supply voltages; and
generating a control signal for each group of analog circuits indicative of the measured performance of said group of analog circuits, and responsively adjusting the received dynamically-adjusted supply voltage based on the control signal.

17. The method of claim 16, wherein the measured performance of each monitoring circuit corresponds to performance of a critical circuit path in said group of analog circuits.

18. The method of claim 17, wherein measuring performance of the critical path in a given group of analog circuits comprises measuring performance of a plurality of critical circuit paths in the given group of analog circuits, and wherein generating the control signal comprises identifying a measurement of a worst-case-scenario critical circuit path of the plurality of critical circuit paths.

19. The method of claim 18, wherein the worst-case-scenario critical circuit path is associated with a corresponding test corner of the plurality of test corners.

20. The method of claim 18, wherein generating the control signal comprises determining the worst-case-scenario critical circuit path by comparing measured performances of the plurality of critical circuit paths.

21. The method of claim 16, the performance of the plurality of groups of analog circuits is measured periodically responsive to changes in temperature.

22. The method of claim 16, wherein the plurality of dynamically-adjusted supply voltages comprises a VDDH dynamically-adjusted supply voltage associated with a VDDH analog voltage domain and a VDDA dynamically-adjusted supply voltage associated with a VDDA analog voltage domain.

23. The method of claim 22, wherein a first group of analog circuits comprises output driver circuits configured to receive the VDDH dynamically-adjusted supply voltage, and wherein a second group of analog circuits comprises a voltage-controlled oscillator (VCO) and a phase-locked loop (PLL) configured to receive the dynamically-adjusted supply voltage from the local linear regulator, the local linear regulator receiving the VDDH dynamically-adjusted supply voltage.

24. The method of claim 22, wherein a first group of analog circuits comprises a slicer, a demultiplexer, a multiplexer, and a variable gain amplifier (VGA), the first group of analog circuits receiving the VDDA dynamically-adjusted supply voltage, and wherein a second group of analog circuits comprises a voltage-controlled oscillator (VCO), the second group of analog circuits receiving the dynamically-adjusted supply voltage from the local linear regulator, the local linear regulator receiving the VDDA dynamically-adjusted supply voltage.

25. The method of claim 24, wherein measuring the performance of the first group of analog circuits comprises measuring performance of a critical path associated with the slicer.

26. The method of claim 22, wherein the plurality of dynamically-adjusted supply voltages further comprises a VDDD dynamically-adjusted supply voltage associated with a digital voltage domain for a group of digital circuits.

27. The method of claim 26, further comprising monitoring the performance of the group of digital circuits using a digital monitoring circuit and responsively generating a control signal for updating the VDDD dynamically-adjusted supply voltage.

28. The method of claim 27, wherein the group of digital circuits comprises a ring oscillator, and wherein the digital monitoring circuit comprises a frequency detector for analyzing the output of the ring oscillator.

\* \* \* \* \*